US012699234B2

(12) United States Patent
Liang et al.

(10) Patent No.: US 12,699,234 B2
(45) Date of Patent: Aug. 4, 2026

(54) PACKAGE DEVICES AND METHODS OF MANUFACTURE

(71) Applicant: Taiwan Semiconductor Manufacturing Co., Ltd., Hsinchu (TW)

(72) Inventors: Shih Wei Liang, Taichung City (TW); Yu-Ming Chou, Hsinchu (TW); Nien-Fang Wu, Chiayi City (TW); Jiun Yi Wu, Zhongli City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 483 days.

(21) Appl. No.: 18/164,310

(22) Filed: Feb. 3, 2023

(65) Prior Publication Data

US 2024/0264388 A1 Aug. 8, 2024

(51) Int. Cl.
*G02B 6/42* (2006.01)
*G02B 6/136* (2006.01)
*H10W 90/00* (2026.01)

(52) U.S. Cl.
CPC .......... *G02B 6/4214* (2013.01); *G02B 6/136* (2013.01); *H10W 90/00* (2026.01)

(58) Field of Classification Search
CPC ...... G02B 6/136; G02B 6/4214; H01L 25/167
See application file for complete search history.

(56) References Cited

U.S. PATENT DOCUMENTS

| | | | | |
|---|---|---|---|---|
| 9,671,574 | B2 * | 6/2017 | Lee | G02B 6/4214 |
| 10,989,885 | B2 * | 4/2021 | Lu | G02B 6/4206 |
| 2010/0278485 | A1 * | 11/2010 | Nakagawa | B29D 11/0075 385/38 |
| 2016/0306110 | A1 * | 10/2016 | Lambert | G02B 6/125 |
| 2020/0278509 | A1 * | 9/2020 | Huang | G02B 6/4214 |
| 2021/0141172 | A1 * | 5/2021 | Zhang | G02B 6/4239 |
| 2022/0155539 | A1 | 5/2022 | Pietambaram et al. | |
| 2022/0404568 | A1 | 12/2022 | Aleksov et al. | |

FOREIGN PATENT DOCUMENTS

TW 202221370 A 6/2022

* cited by examiner

*Primary Examiner* — Daniel Petkovsek
(74) *Attorney, Agent, or Firm* — Slater Matsil, LLP

(57) ABSTRACT

Package devices and methods of manufacture are discussed. In an embodiment, a method of manufacturing an integrated circuit device includes: forming an optical device layer; forming an optical layer on the optical device layer; after the forming the optical layer, forming a first opening in the optical layer; and embedding a reflective structure in the first opening.

20 Claims, 19 Drawing Sheets

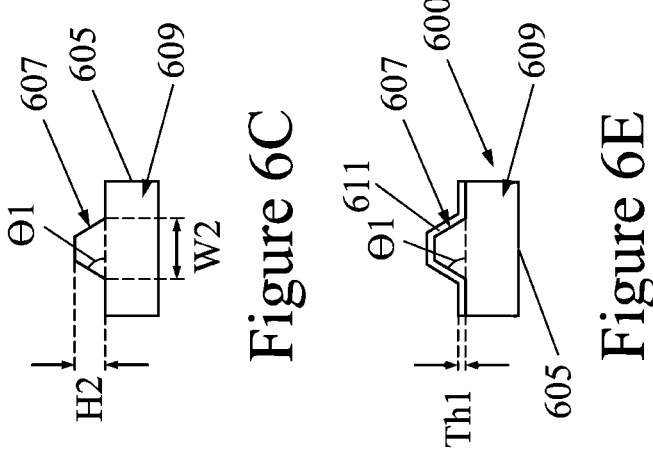
Figure 6C
Figure 6E
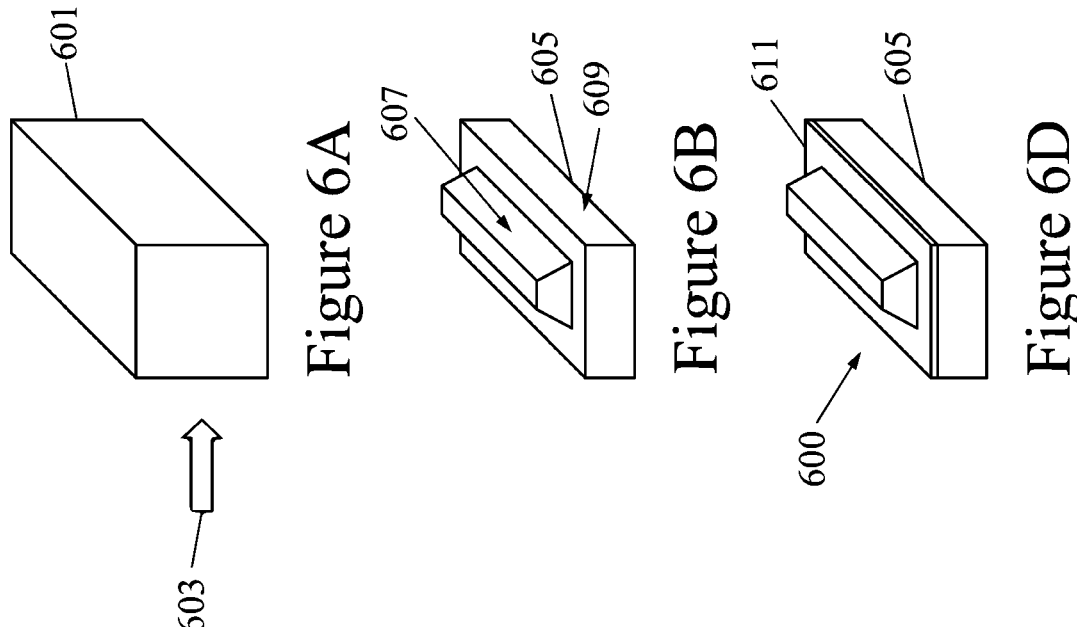
Figure 6A
Figure 6B
Figure 6D

PACKAGE DEVICES AND METHODS OF MANUFACTURE

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating long-range optical components and short-range electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A through 6E depicts a formation of a first design-in mirror structure in accordance with some embodiments.

DETAILED DESCRIPTION

Figure 1:
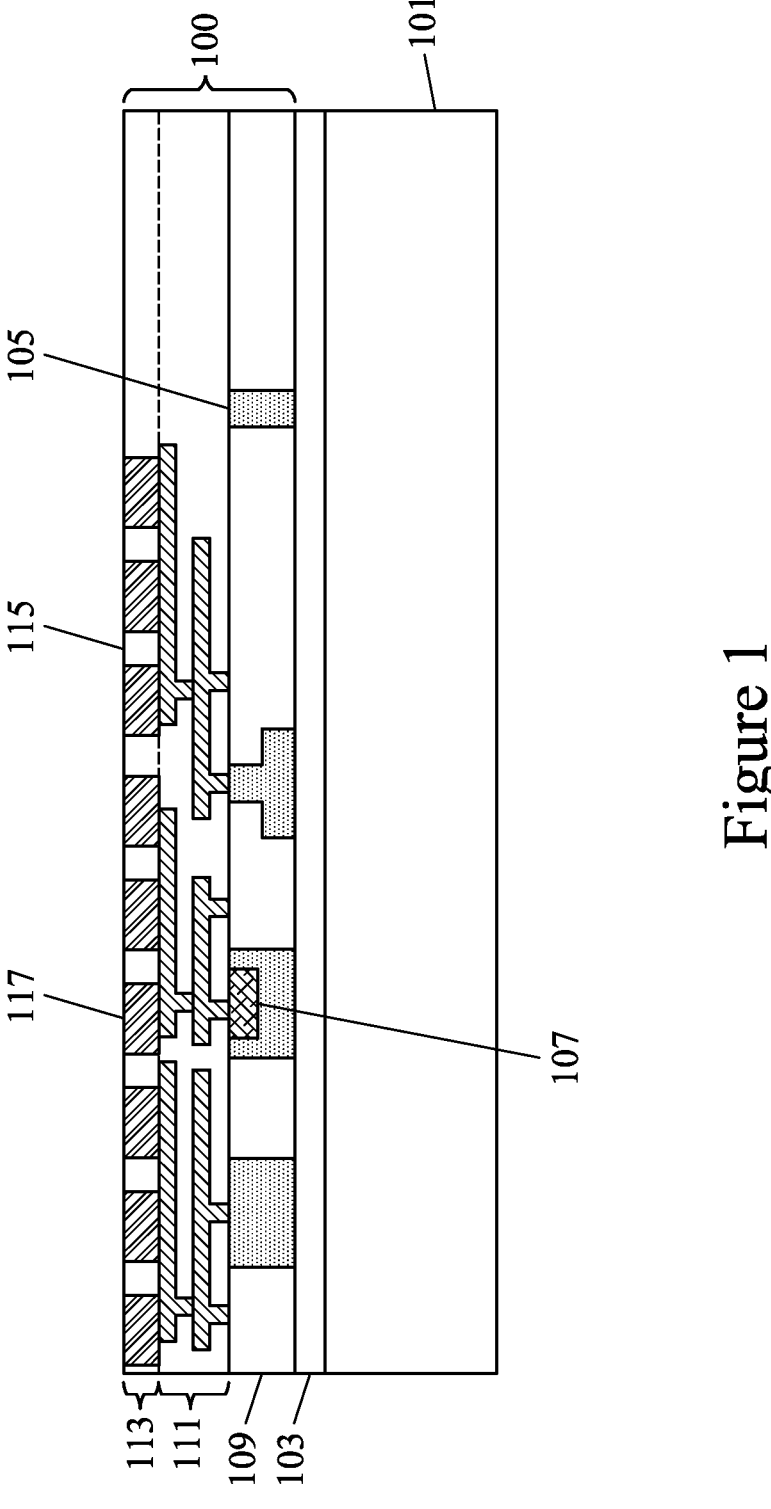
FIG. 1 depicts a formation of an optical device over a support substrate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be discussed with respect to certain embodiments in which a design-in mirror structure is formed in a backside waveguide structure of an optical device bonded to a semiconductor device. An integrated circuit device may include an electrical integrated circuit (EIC) bonded to an optical engine with a backside waveguide structure containing a design-in mirror structure. The optical engine is formed and then subsequently bonded to an EIC, the backside waveguide structure (without the design-in mirror) is then subsequently formed on the opposite side of the optical engine as the EIC. Embodiments for then forming the design-in mirror in the backside waveguide structure are discussed below. However, the embodiments presented herein are intended to be illustrative and are not intended to limit the embodiments to the precise descriptions as discussed. Rather, the embodiments discussed may be incorporated into a wide variety of implementations, and all such implementations are fully intended to be included within the scope of the embodiments.

With reference now to FIG. 1, there is illustrated a formation of a first device layer 100, in accordance with some embodiments. In the particular embodiment illustrated in FIG. 1, the first device layer 100 is an optical device, such as a photonic integrated circuit (PIC). In accordance with some embodiments, the first device layer 100 is formed over a first substrate 101 and a first insulating layer 103. A layer of material (not separately illustrated) may be formed over the first insulating layer 103 and may be utilized as a base material for first optical components 105 formed in the first device layer 100. In an embodiment, at a beginning of the manufacturing process of the first device layer 100, the first substrate 101, the first insulating layer 103, and the layer of material for the first optical components 105 may collectively be part of a silicon-on-insulator (SOI) substrate. Looking first at the first substrate 101, the first substrate 101 may be a semiconductor material such as silicon or germanium, a dielectric material such as glass, or any other suitable material that allows for structural support of overlying devices.

The first insulating layer 103 may be a dielectric layer that separates the first substrate 101 from the overlying first device layer 100 and can additionally, in some embodiments, serve as a portion of cladding material that surrounds the first optical components 105. In an embodiment the first insulating layer 103 may be silicon oxide, silicon nitride, germanium oxide, germanium nitride, combinations of these, or the like, formed using a method such as implantation (e.g., to form a buried oxide (BOX) layer) or else may be deposited onto the first substrate 101 using a deposition method such as chemical vapor deposition (CVD), atomic layer deposition (ALD), physical vapor deposition (PVD), combinations of these, or the like. However, any suitable material and method of manufacture may be used.

The material utilized in forming the first optical components 105 of the first device layer 100 is initially (prior to patterning) a conformal layer of material that will be used to begin manufacturing the first optical components 105 of the first device layer 100. In an embodiment the material for the first optical components 105 may be a translucent material that can be used as a core material for the desired first optical components 105, such as a semiconductor material such as silicon, germanium, silicon germanium, combinations of these, or the like. In other embodiments, the material for the first optical components 105 may be a dielectric material such as silicon nitride, silicon oxide, or the like. In embodiments in which the material of the first optical components 105 is deposited, the material for the first optical components 105 may be deposited using a method such as epitaxial growth, CVD, ALD, PVD, combinations of these, or the like. In other embodiments in which the first insulating layer 103 is formed using an implantation method, the material of the first optical components 105 may initially be part of the first substrate 101 prior to the implantation process to form the first insulating layer 103. However, any suitable materials and methods of manufacture may be utilized to form the material of the first optical components 105.

FIG. 1 further illustrates that, once the material for the first optical components 105 is ready, the first optical components 105 for the first device layer 100 are manufactured using the material for the first optical components 105. In embodiments the first optical components 105 of the first device layer 100 may include such components as optical waveguides (e.g., ridge waveguides, rib waveguides, buried channel waveguides, diffused waveguides, etc.), couplers (e.g., grating couplers, edge couplers, etc.), directional couplers, optical modulators (e.g., Mach-Zehnder silicon-photonic switches, microelectromechanical switches, microring resonators, etc.), amplifiers, multiplexors, demultiplexors, optical-to-electrical converters (e.g., P-N junctions), electrical-to-optical converters, lasers, combinations of these, or the like. However, any suitable first optical components 105 may be used.

In accordance with some embodiments, to begin forming the first optical components 105 from the initial material, the material for the first optical components 105 may be patterned into the desired shapes for the first optical components 105 of the first device layer 100. In an embodiment, the material for the first optical components 105 may be patterned using, e.g., one or more photolithographic masking and etching processes. However, any suitable method of patterning the material for the first optical components 105 may be utilized. For some of the first optical components 105, such as waveguides or edge couplers, the patterning process may be all or at least most of the manufacturing that is used to form these first optical components 105.

FIG. 1 additionally illustrates that, for those components that utilize further manufacturing processes, such as Mach-Zehnder silicon-photonic switches that utilize resistive heating elements, additional processing may be performed either before or after the patterning of the material for the first optical components 105. For example, implantation processes, additional deposition and patterning processes for different materials (e.g., resistive heating elements, III-V materials for converters), combinations of all of these processes, or the like, can be utilized to help further the manufacturing of the various desired first optical components 105. In a particular embodiment, a deposition of a semiconductor material 107 such as germanium may be performed on a patterned portion of the material of the first optical components 105. In such an embodiment, the semiconductor material 107 may be epitaxially grown in order to help manufacture, e.g., a photodiode for an optical-to-electrical converter. All such manufacturing processes and all suitable first optical components 105 may be manufactured, and all such combinations are fully intended to be included within the scope of the embodiments.

Once the individual first optical components 105 of the first device layer 100 have been formed, a second insulating layer 109 may be deposited to cover the first optical components 105 of the first device layer 100 and may provide additional cladding material. In an embodiment, the second insulating layer 109 may be a dielectric layer that separates the individual first optical components 105 of the first device layer 100 from each other and from overlying structures and may serve as cladding material that surrounds the first optical components 105. In an embodiment, the second insulating layer 109 may be silicon oxide, silicon nitride, germanium oxide, germanium nitride, combinations of these, or the like. The second insulating layer 109 may be formed using a deposition method such as CVD, ALD, PVD, combinations of these, or the like. Once the material of the second insulating layer 109 has been deposited, the material may be planarized using, e.g., a chemical mechanical polishing process in order to either planarize a top surface of the second insulating layer 109 (in embodiments in which the second insulating layer 109 is intended to fully cover the first optical components 105) or else planarize the second insulating layer 109 with top surfaces of the first optical components 105. However, any suitable material and method of manufacture may be used.

FIG. 1 further illustrates that, once the first optical components 105 of the first device layer 100 have been manufactured and the second insulating layer 109 has been formed, first metallization layers 111 are formed in order to electrically connect the first device layer 100 to control circuitry, to each other, and to subsequently attached devices (not illustrated in FIG. 1 but illustrated and described further below with respect to FIG. 2). In an embodiment the first metallization layers 111 are formed of alternating layers of dielectric and conductive material and may be formed through any suitable processes (such as deposition, damascene, dual damascene, etc.). In particular embodiments, there may be multiple layers of metallization used to interconnect the various first optical components 105, but the precise number of first metallization layers 111 is dependent upon the design of the first device layer 100.

In accordance with some embodiments, following the formation the first metallization layers 111 a first bonding layer 113 is formed over the first metallization layers 111. In an embodiment, the first bonding layer 113 may be used as part of a dielectric-to-dielectric and metal-to-metal bond to subsequently attached structures (not illustrated in FIG. 1 but illustrated and described further below with respect to FIG. 2). In accordance with some embodiments, the first bonding layer 113 are formed of a dielectric material 115 such as silicon oxide, silicon nitride, or the like. The dielectric material 115 may be deposited using any suitable method, such as CVD, high-density plasma chemical vapor deposition (HDPCVD), PVD, ALD, or the like. However, any suitable materials and deposition processes may be utilized.

Once the dielectric material 115 have been formed, openings (not separately illustrated) in the dielectric material 115 are formed to expose conductive portions of the underlying layers and in preparation to form first bond pads 117 within the first bonding layer 113. Once the openings have been formed within the dielectric material 115, the openings may be filled with a seed layer (not separately illustrated) and a plate metal to form the first bond pads 117 within the dielectric material 115. The seed layer may be blanket deposited over top surfaces of the dielectric material 115 and the exposed conductive portions of the underlying layers and sidewalls of the openings. The seed layer may comprise a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like. The plate metal may be a fill material. A barrier layer (not separately illustrated) may be blanket deposited over top surfaces of the dielectric material 115 and sidewalls of the openings before filling the seed layer in the openings. The barrier layer may comprise titanium, titanium nitride, tantalum, tantalum nitride, or the like. Following the filling of the openings, a planarization process, such as a chemical mechanical polishing (CMP), is performed to remove excess portions of the seed layer and the plate metal, forming the first bond pads 117 within first bonding layer 113.

Figure 2:
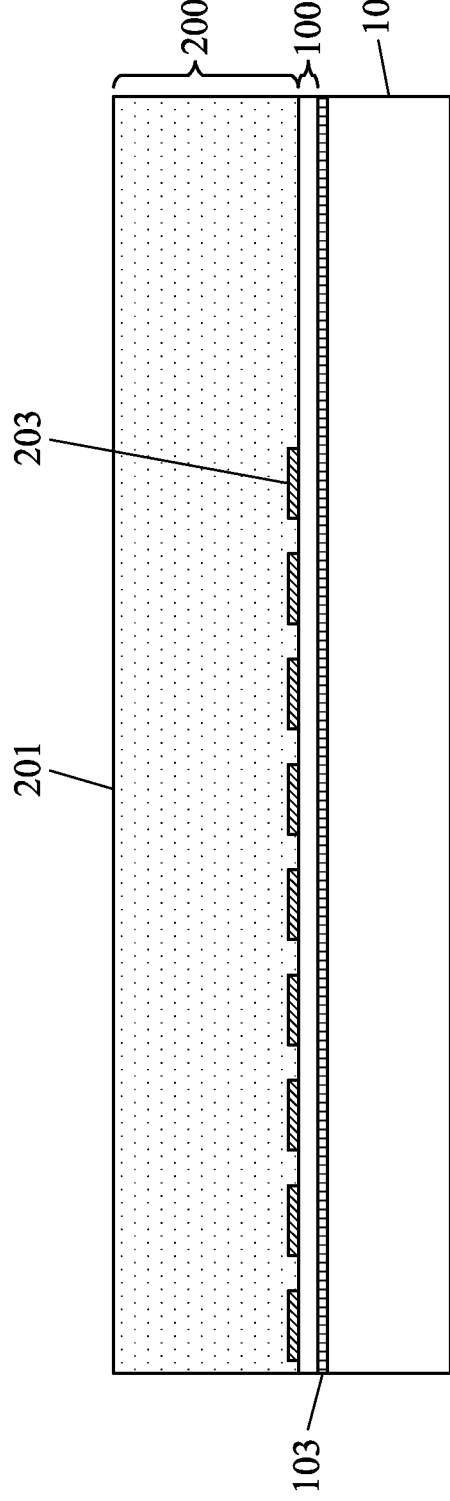
FIG. 2 depicts a bonding of a semiconductor die to the optical device in accordance with some embodiments.

FIG. 2 illustrates a bonding of a semiconductor device 200 to the first device layer 100 (wherein the first device layer 100 is illustrated in a simplified form in FIG. 2 for clarity). In some embodiments, the semiconductor device 200 is an electronic integrated circuit (EIC—e.g., devices without optical devices) and may have a semiconductor substrate 201, a layer of active devices (not separately illustrated), an overlying interconnect structure (not separately illustrated), a second bonding layer (not separately illustrated), and associated second bond pads 203. In an embodiment, the active devices may be transistors, capacitors, resistors, and the like formed over the semiconductor substrate 201, the interconnect structure may be similar to the first metallization layers 111, the second bonding layer may be similar to the first bonding layer 113, and the second bond pads 203 may be similar to the first bond pads 117. However, any suitable devices may be utilized.

In an embodiment, the semiconductor device 200 may be configured to work with the first device layer 100 for a desired functionality. In some embodiments the semiconductor device 200 may be an ASIC device, a high bandwidth memory (HBM) module, an xPU, a logic die, a 3DIC die, a CPU, a GPU, a SoC die, a MEMS die, combinations of these, or the like. Any suitable device with any suitable functionality, may be used, and all such devices are fully intended to be included within the scope of the embodiments.

Once the semiconductor device 200 has been prepared, the semiconductor device 200 may be bonded to the first device layer 100. In an embodiment the semiconductor device 200 may be bonded to the first device layer 100 using, e.g., a system on integrated circuit (SoIC) bond such as a dielectric-to-dielectric and metal-to-metal bonding process. In such an embodiment the semiconductor device 200 is bonded to the first bond layer 113 of the first device layer 100 by bonding both the first bond pads 117 to the second bond pads 203 and by bonding the dielectrics within the first bonding layer 113 (e.g., the dielectric material 115) to the dielectrics within the second bonding layer. In this embodiment a surface of the semiconductor device 200 and the first device layer 100 may first be activated utilizing, e.g., a dry treatment, a wet treatment, a plasma treatment, exposure to an inert gas, exposure to $H_2$, exposure to $N_2$, exposure to $O_2$, or combinations thereof, as examples. In embodiments where a wet treatment is used, an RCA cleaning may be used, for example. However, any suitable activation process may be utilized.

After the activation process the semiconductor device 200 and the first device layer 100 may be cleaned using, e.g., a chemical rinse, and then the semiconductor device 200 is aligned and placed into physical contact with the first device layer 100. The semiconductor device 200 and the first device layer 100 are then subjected to thermal treatment and contact pressure to bond the semiconductor device 200 and the first device layer 100. For example, the semiconductor device 200 and the first device layer 100 may be subjected to a pressure of about 200 kPa or less, and a temperature between about 25° C. and about 250° C. to fuse the semiconductor device 200 and the first device layer 100. The semiconductor device 200 and the first device layer 100 may then be subjected to a temperature at or above the eutectic point for material of the first bond pads 117 and the second bond pads 203, e.g., between about 150° C. and about 650° C., to fuse the first bond pads 117 and the second bond pads 203. In this manner, bonding of the semiconductor device 200 and the first device layer 100 forms a bonded device. In some embodiments, the bonded semiconductor device 200 is baked, annealed, pressed, or otherwise treated to strengthen or finalize the bond.

Additionally, while the above description describes a dielectric-to-dielectric and metal-to-metal bonding process, this is intended to be illustrative and is not intended to be limiting. In yet other embodiments, the first device layer 100 may be bonded to the semiconductor device 200 by direct surface bonding, metal-to-metal bonding, or another bonding process. In other embodiments, the semiconductor device 200 and the first device layer 100 are bonded by metal-to-metal bonding that is achieved by fusing conductive elements. Any suitable bonding process may be utilized, and all such methods are fully intended to be included within the scope of the embodiments.

Figure 3:
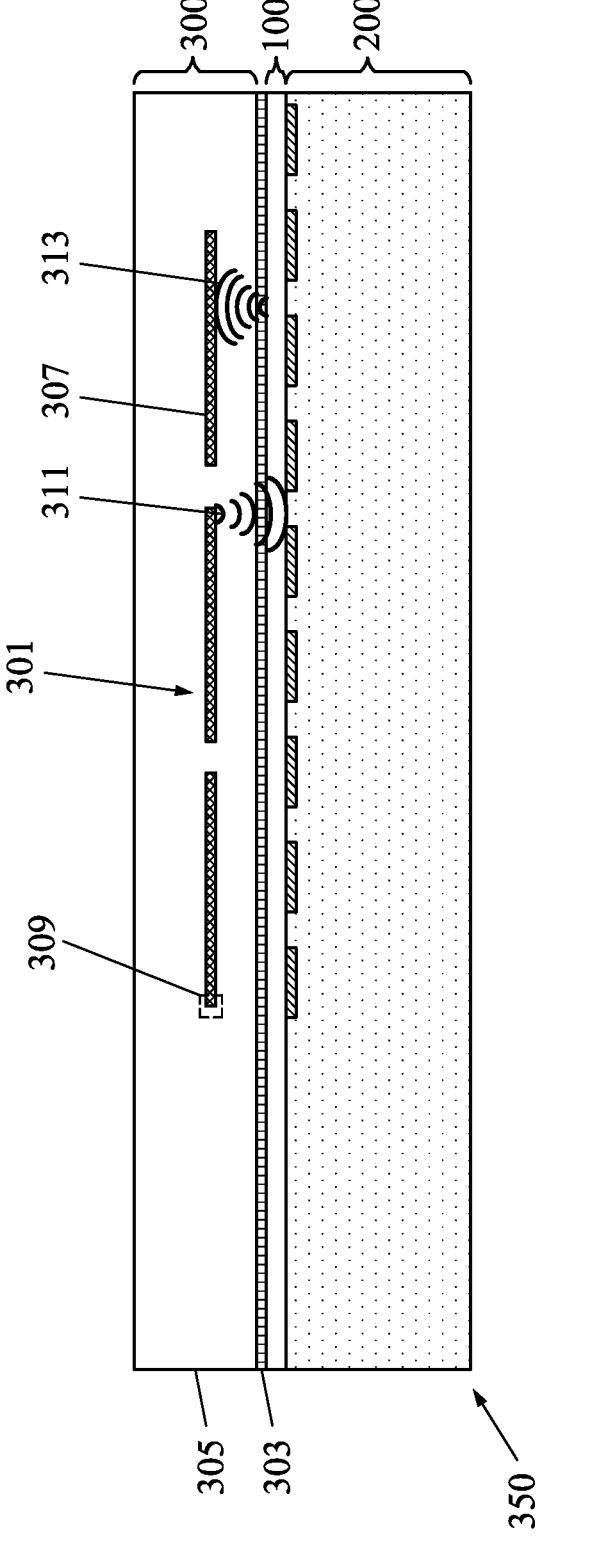
FIG. 3 depicts a removal of the support substrate and formation of a backside optical interconnect in accordance with some embodiments.

FIG. 3 illustrates a removal of the first substrate 101 and, optionally, the first insulating layer 103, thereby exposing a surface of the first device layer 100 and a formation of a backside optical layer 300 (e.g. an optical interconnect structure) over the exposed surface of the first device layer 100. Following the formation of the backside optical layer 300 over the first device layer 100 opposite the semiconductor device 200 bonded to the first device layer 100 a PIC device 350 is depicted. In an embodiment the first substrate 101 and, optionally, the first insulating layer 103 may be removed using a planarization process, such as a CMP process, a grinding process, one or more etching processes, combinations of these, or the like. However, any suitable method may be used in order to remove the first substrate 101 and the first insulating layer 103.

In accordance with some embodiments, once the first substrate 101 and the first insulating layer 103 have been removed, the backside optical layer 300 of second optical components 301 may be formed on a first dielectric layer 303 deposited onto a back side of the first device layer 100 of the first optical components 105. Alternatively, in an embodiment where the first insulating layer 103 is not removed, the backside optical layer 300 of the second optical components 301 may be formed on a surface of the first insulating layer 103 (the surface exposed by the removal of the first substrate). For the sake of clarity the remainder of this discussion and the Figures will reference the first dielectric layer 303.

Further, in some embodiments, the semiconductor device 200 may act in part as a support structure, following the removal of the first substrate 101, facilitating the formation of the backside optical layer 300 onto the first device layer 100. In embodiments where the semiconductor device 200 acts as the support structure following the removal of the first substrate 101, the semiconductor device 200 may further facilitate additional manufacturing subsequently performed following the formation of the backside optical layer 300.

In an embodiment, at a beginning of a manufacturing process of the backside optical layer 300, the first dielectric layer 303 may be a dielectric layer that separates the first device layer 100 from the overlying backside optical layer 300 and can additionally, in some embodiments, serve as a portion of cladding material that surrounds the second optical components 301. In an embodiment the first dielectric layer 303 may be silicon oxide, silicon nitride, germanium oxide, germanium nitride, combinations of these, or the like, and may be deposited onto the first device layer 100 using a deposition method such as CVD, ALD, PVD, combinations of these, or the like. However, any suitable material and method of manufacture may be used.

Once the first dielectric layer 303 has been formed, the backside optical layer 300 may be manufactured of, for example, alternating series of second optical components 301 and second insulating layers 305 (represented in FIG. 3 as a single layer of the second optical components 301 surrounded by the material of the second insulating layers 305, e.g. a neighboring environment to the second optical components 301). Looking first at the second optical components 301, the material utilized in forming the second optical components 301 of the backside optical layer 300 is initially (prior to patterning) a conformal layer of material that will be used to begin manufacturing the second optical components 301 of the backside optical layer 300. In an embodiment the material for the second optical components 301 may be a translucent material that can be used as a core material for the desired second optical components 301, such as a semiconductor material such as silicon, germanium, silicon germanium, combinations of these, or the like. In other embodiments, the material for the second optical components 301 may be a dielectric material such as silicon nitride, silicon oxide, or the like. In embodiments in which the material of the second optical components 301 is deposited, the material for the second optical components 301 may be deposited using a method such as CVD, ALD, PVD, epitaxial growth, combinations of these, or the like. However, any suitable materials and methods of manufacture may be utilized to form the material of the second optical components 301.

FIG. 3 further illustrates that, once the material for the second optical components 301 is ready, the second optical components 301 for the backside optical layer 300 are manufactured using the material for the second optical components 301. In embodiments the second optical components 301 of the backside optical layer 300 may include such components as optical waveguides (e.g., ridge waveguides, rib waveguides, buried channel waveguides, diffused waveguides, etc.), couplers (e.g., grating couplers, edge couplers, etc.), directional couplers, optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. However, any suitable second optical components 301 may be used.

In accordance with some embodiments, to begin forming the second optical components 301 from the material for the second optical components 301, the material for the second optical components 301 may be patterned into the desired shapes for the second optical components 301 of the backside optical layer 300. In an embodiment, the material for the second optical components 301 may be patterned using, e.g., one or more photolithographic masking and etching processes. However, any suitable method of patterning the material for the second optical components 301 may be utilized. For some of the second optical components 301, such as waveguides or edge couplers, the patterning process may be all or at least most of the manufacturing that is used to form these second optical components 301.

FIG. 3 additionally illustrates that, for those components that utilize further manufacturing processes, such as Mach-Zehnder silicon-photonic switches that utilize resistive heating elements, additional processing may be performed either before or after the patterning of the material for the second optical components 301. For example, implantation processes, additional deposition and patterning processes for different materials (e.g., resistive heating elements, III-V materials for converters), combinations of all of these processes, or the like, can be utilized to help further the manufacturing of the various desired second optical components 301. All such manufacturing processes and all suitable second optical components 301 may be manufactured, and all such combinations are fully intended to be included within the scope of the embodiments.

Once the individual second optical components 301 of the backside optical layer 300 have been formed (or prior to and after the formation of the second optical components 301), the second insulating layer 305 may be deposited to cover the second optical components 301 of the backside optical layer 300 and may provide additional cladding material. In an embodiment, the second insulating layer 305 may be a dielectric layer that separates the individual second optical components 301 of the backside optical layer 300 from each other and from other surrounding structures and may serve as cladding material that surrounds the second optical components 301. In an embodiment, the second insulating layer 305 may be silicon oxide, silicon nitride, germanium oxide, germanium nitride, combinations of these, or the like. The second insulating layer 305 may be formed using a deposition method such as CVD, ALD, PVD, combinations of these, or the like. Once the material of the second insulating layer 305 has been deposited, the material may be planarized using, e.g., a CMP process in order to either planarize a top surface of the second insulating layer 305 (in embodiments in which the second insulating layer 305 is intended to fully cover the second optical components 301) or else planarize the second insulating layer 305 with top surfaces of the second optical components 301. However, any suitable material and method of manufacture may be used.

Figure 9:
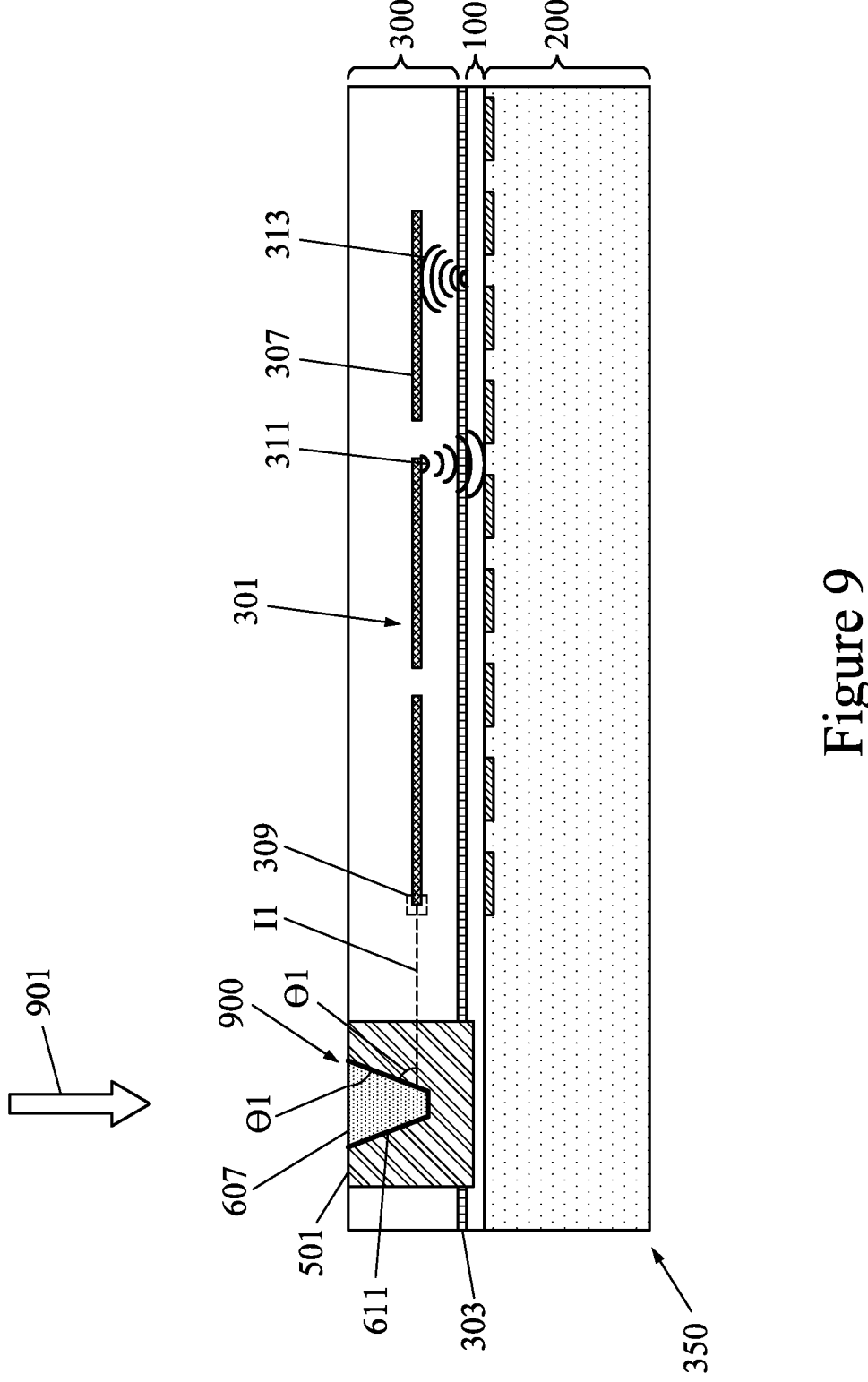
FIG. 9 depicts a planarization process of the design-in mirror structure and the bonding material in accordance with some embodiments.

In accordance with some embodiments, the second optical components 301 may include waveguides 307, a first coupler component 309, a first directional optical component 311 (represented in FIG. 9 by transmission lines) and a second directional optical component 313 (represented in FIG. 9 by transmission lines). In an embodiment, the first coupler component 309 is adjacent the waveguides 307 and is surrounded by the second insulating layer 305. The first coupler component 309 may be an edge coupler, a grating coupler, a tip, a rib, or the like. However, any suitable type of coupler for receiving optical signals may be utilized.

Further, the first directional optical components 311 and the second directional optical components 313 are formed in order to provide an optical link between second optical components 301 within the backside optical layer 300 and the first optical components 105 within the first device layer 100. In particular embodiments the first direction optical components 311 and the second directional optical components 313 may be couplers such as grating couplers (which may interact with grating couplers within the first device layer 100), waveguides which are evanescently coupled to adjacent waveguides in the first device layer 100, combinations of these, or the like. However, any suitable component and any suitable method of directing optical signals from the second optical components 301 to the first device layer 100 may be utilized, and all such components are fully intended to be included within the scope of the embodiments.

Further, in accordance with some embodiments, electrical structures are formed within the PIC device 350 allowing for electrical connection to external devices to and from the PIC device 350. Electrical structures, such as through vias (not separately illustrated) may be formed extending through either or both the backside optical layer 300 and the semiconductor device 200 to the conductive material of the first metallization layers 111 of the first device layer 100 so as to provide a quick passage of power, data, and ground through to the first device layer 100. External connectors (not separately illustrated) may be formed over the through vias and may be used to electrically couple and physically connect the PIC device 350 to other external devices. All such electrical connections are fully intended to be included within the scope of the embodiments.

Figure 4:
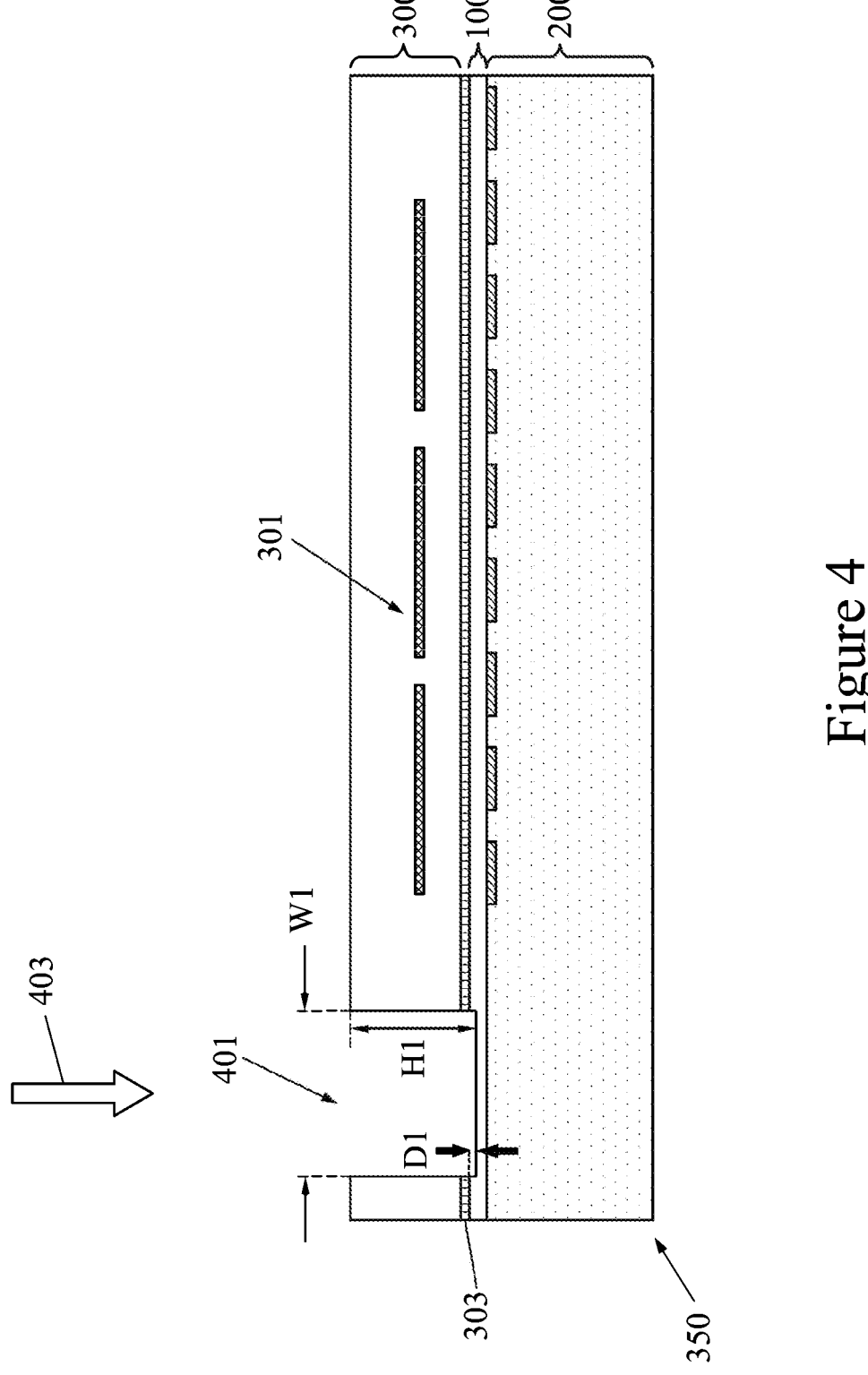
FIG. 4 depicts a formation of a first hole in the backside optical interconnect in accordance with some embodiments.

FIG. 4 illustrates a formation of a first opening 401 positioned in the PIC device 350 at a desired location for placement of a first optical structure 900 (illustrated in FIG. 9 and discussed in greater detail below). In an embodiment, the first opening 401 extends through the backside optical layer 300, through the first dielectric layer 303 and partially into the first device layer 100. In accordance with some embodiments, the first opening 401 is formed by a first etching process 403 (represented in FIG. 4 by the arrow labeled 403). In an embodiment the first etching process 403 may be one or more etching processes, such as a photolithographic masking and etching process, such as a dry etch process, a wet etch process, the like, or a combination thereof. However, any suitable etching process utilizing any suitable etchants may be used.

In accordance with some embodiments, the first opening 401 may only extend into the first device layer 100 by a first depth D1 in a range of 50 Å to 10 μm. It has been observed that if the first opening 401 extends into the first device layer 100 by an amount greater than the first depth D1 then worse adhesion and optical loss may occur. It has also been observed that if the first opening 401 extends into the first device layer 100 by an amount less than the first depth D1 then worse adhesion and optical loss may occur.

In an embodiment, following the first etching process 403, the first opening 401 may have straight sidewalls (e.g. vertical parallel sidewalls) and a planar bottom surface. Further, the first opening 401 may have a first width W1 in a range of 5 μm to 50 μm and a first height H1 in a range of 5 μm to 20 μm. It has been observed that if the first opening 401 has a width less than the first width W1 then the first optical structure 900 may have insufficient space to be positioned within the PIC device 350 and if the first opening 401 has a width greater than the first width W1 then the first optical structure 900 may not be able to suitably interact with the second optical components 301. It has also been observed that if the first opening 401 has a height less than the first height H1 then the first optical structure 900 may have insufficient space to be positioned within the PIC device 350 and if the first opening 401 has a height greater than the first height H1 then the first opening 401 may extend to an undesirable depth into the first device layer 100.

Figure 5:
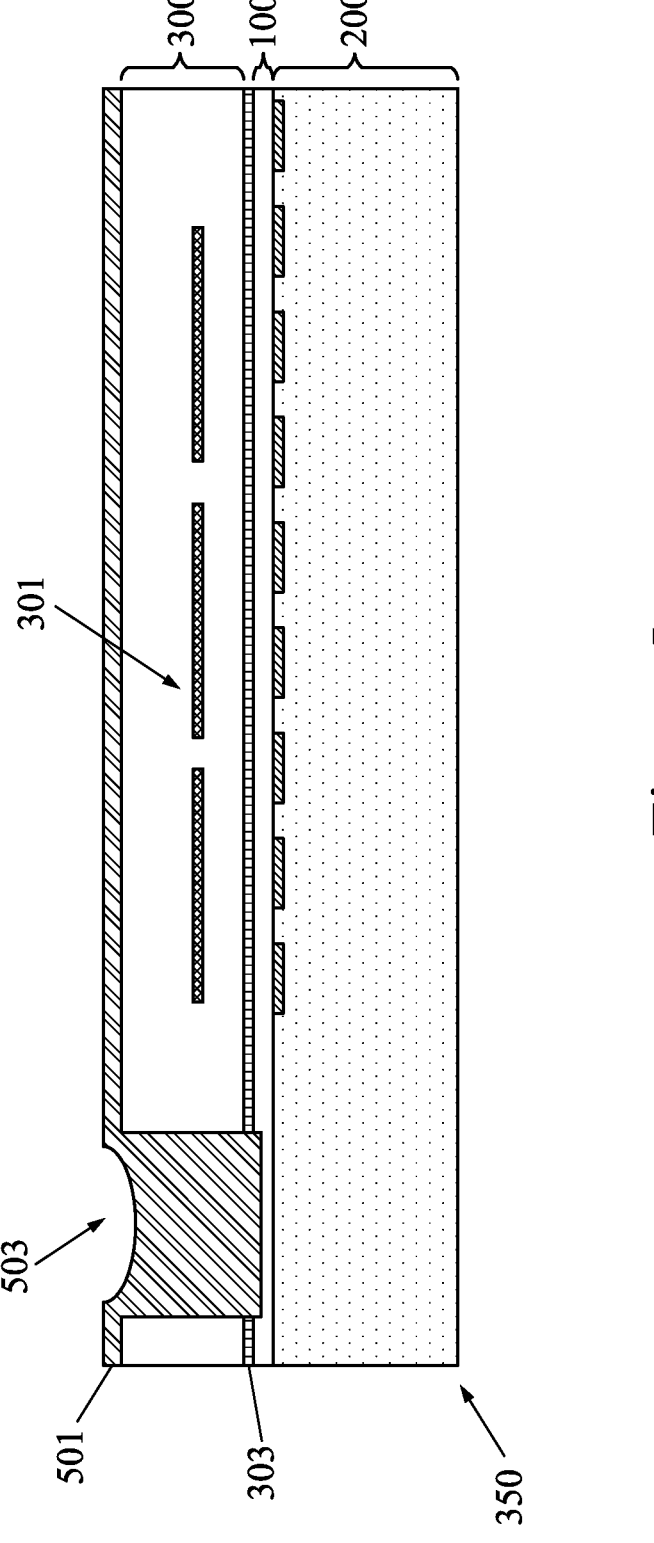
FIG. 5 depicts a depositing of a bonding material in the first hole in accordance with some embodiments.

FIG. 5 illustrates a formation or placement of a bonding material 501 into the first opening 401 and along a major surface of the backside optical layer 300 opposite the semiconductor device 200. In accordance with some embodiments, the bonding material 501 may be formed of a polymer, such as polyimide (PI), polybenzoxazole (PBO), benzocyclobutene (BCB), Ajinomoto build-up film (ABF), the like, or a combination thereof. The bonding material 501 may be deposited by spin-on coating, CVD, laminating, the like, or a combination thereof. However, any suitable material or deposition process may be utilized.

In accordance with some embodiments, the bonding material 501 should have a refraction index similar to the material of the second insulating layer 305. The refraction index of the bonding material 501 may be in a range of 1.42 to 1.46. It has been observed that if the refraction index is outside this range than the signal loss between the first optical structure 900 and the second optical components 301 is too great. Further, in some embodiments, following the deposition of the bonding material 501 a recess 503 is present in the bonding material 501 along the major surface of the backside optical layer 300 at a location above the first opening 401. The recess 503 may help facilitate the displacement of the bonding material 501 during placement of the first optical structure 900 into the first opening 401.

FIGS. 6A through 6E illustrate one embodiment of a formation of a first intermediate optical structure 600 that may be utilized in ultimately forming the first optical structure 900. FIG. 6A illustrates an isometric view of a base structure 601 that when processed by a first manufacturing process 603 forms a first shaping structure 605 utilized as a base for the first intermediate optical structure 600. The base structure 601 comprises a material (e.g. a base material) suitable for manufacturing a desired shape of the first intermediate optical structure 600 by initially forming the first shaping structure 605 through the first manufacturing process 603. In accordance with some embodiments, the base structure 601 comprises silicon (e.g. a silicon bar).

FIG. 6B illustrates an isometric view of the first shaping structure 605 formed to the desired shape by the first manufacturing process 603 applied to the base structure 601. In accordance with some embodiments, the first manufacturing process 603 patterns the base structure 601 using, e.g., one or more photolithographic masking and etching processes. In this embodiment, the first manufacturing process 603 forms a trapezoidal prism from a first portion 607 of the base structure 601 over a rectangular prism of a second portion 609 of the base structure 601. In accordance with some embodiments, the first portion 607 is formed to a second height H2, the second height H2 in a range of 3 μm to 18 μm and has a second width W2 at the base of the first portion 607, the second width W2 being in a range of 3 μm to 48 μm. It has been observed that if the first portion 607 has a height not within the range for the second height H2 or a width not within the range of the second width W2 then the desired geometry of the first optical structure 900 is not suitable and unacceptable signal loss occurs between the first optical structure 900 and the first coupler component 309 of the second optical components 301.

FIG. 6C illustrates a sectional view of the first shaping structure 605 of FIG. 6B. In FIG. 6C a first angle Θ1 between a first sloped side of the first portion 607 of the base structure 601 and a first top surface of the second portion 609 of the base structure 601 exists. In accordance with some embodiments, the first angle Θ1 may be in a range of 40 degrees to 60 degrees (such as 42.5 degrees, 45 degrees, or 54.7 degrees). It has been observed that if the angle between the first sloped side and the first top surface is not within the range of the first angle Θ1 an unacceptably poor signal retention occurs between the first optical structure 900 and the first coupler component 309 of the second optical components 301.

FIG. 6D illustrates an isometric view of a first reflective coating 611 formed over the first shaping structure 605. In accordance with some embodiments, the first reflective coating 611 may be a reflective material such as a metal. The metal for the first reflective coating 611 is selected such that a desired signal transmission between the first optical structure 900 and the first coupler component 309 of the second optical components 301 occurs based on the reflective properties of the metal and the first angle Θ1. In an embodiment, the metal utilized for the first reflective coating 611 may be titanium, titanium nitride, aluminum, aluminum nitride, gold, gold nitride, aluminum copper, or the like. The first reflective coating 611 may be deposited over the first shaping structure 605 by PVD, CVD, ALD, or the like. However, any suitable material or deposition process may be utilized FIG. 6E illustrates a sectional view of the first reflective coating 611 formed over the first shaping structure 605 of FIG. 6D. In accordance with some embodiments, the first reflective coating 611 has a first surface roughness in a range of 0.0 nm to 2.0 nm. It has been observed that if the first surface roughness exceeds 2.0 nm then unacceptable signal loss may occur between the first optical structure 900 and the second optical components 301. Further, in an embodiment, the first reflective coating 611 is formed over the first shaping structure 605 to a first thickness Th1, the first thickness Th1 in a range from 500 nm to 1 μm. It has been observed that if the first reflective coating 611 is formed to a thickness outside the range of the first thickness Th1 then cracking may occur.

Figure 7B:
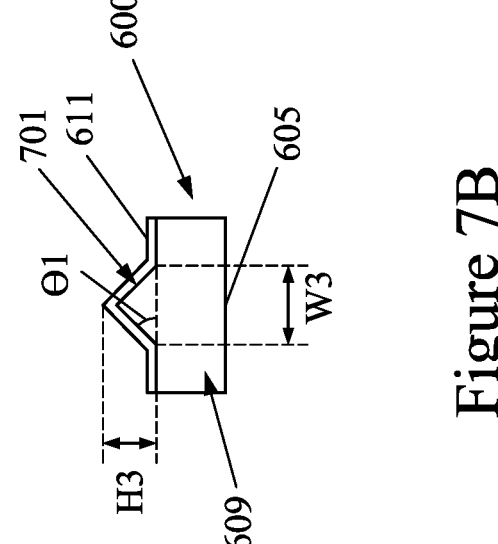
FIGS. 7A and 7B depict a formation of a second design-in mirror structure in accordance with some embodiments.
Figure 7A:
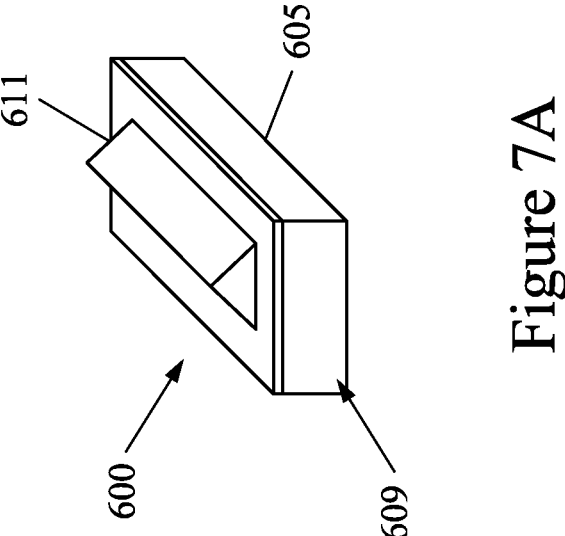

FIGS. 7A and 7B illustrate another embodiment of the formation of the first intermediate optical structure 600 that may be utilized in ultimately forming the first optical structure 900. The structures and processes discussed with respect to FIGS. 7A and 7B are similar as those discussed with respect to FIGS. 6A through 6E. FIG. 7A illustrates an isometric view of the first reflective coating 611 formed over the first shaping structure 605 following the first manufacturing process 603 applied to the base structure 601. In this embodiment, the first manufacturing process 603 modifies the base structure 601 such that the shaping structure 605 has a third portion 701 that is a triangular prism over the rectangular prism of the second portion 609 of the base structure 601.

FIG. 7B illustrates a cross sectional view of FIG. 7A in which the first angle Θ1 exists between a first sloped side of the third portion 701 of the base structure 601 and a first top surface of the second portion 609 of the base structure 601. In accordance with some embodiments, the first reflective coating 611 has the first surface roughness and the first thickness. Further, in accordance with some embodiments, the third portion 701 has a third height H3 in a range of 3 μm to 18 μm and a third width W3 at the base of the third portion 701 in a range of 3 μm to 48 μm. It has been observed that if the third portion 701 has a height not within the range for the third height H3 or a width not within the range of the third width W3 then the desired geometry of the first optical structure 900 cannot be achieved and unacceptable signal loss occurs between the first optical structure 900 and the first coupler component 309 of the second optical components 301.

The structures formed in FIGS. 6A through 6E and 7A through 7B are merely two examples of an intermediate optical structure that may be ultimately used in forming the first optical structure 900. Other embodiments where the base structure 601 is processed to form other shapes from the base structure 601 such as consecutive sloped surface, a discontinuous sloped surface, a triangular pyramid, a square pyramid, other triangular shapes, other square shapes, or the like are fully intended to be included within the scope of the embodiments.

Figure 8:
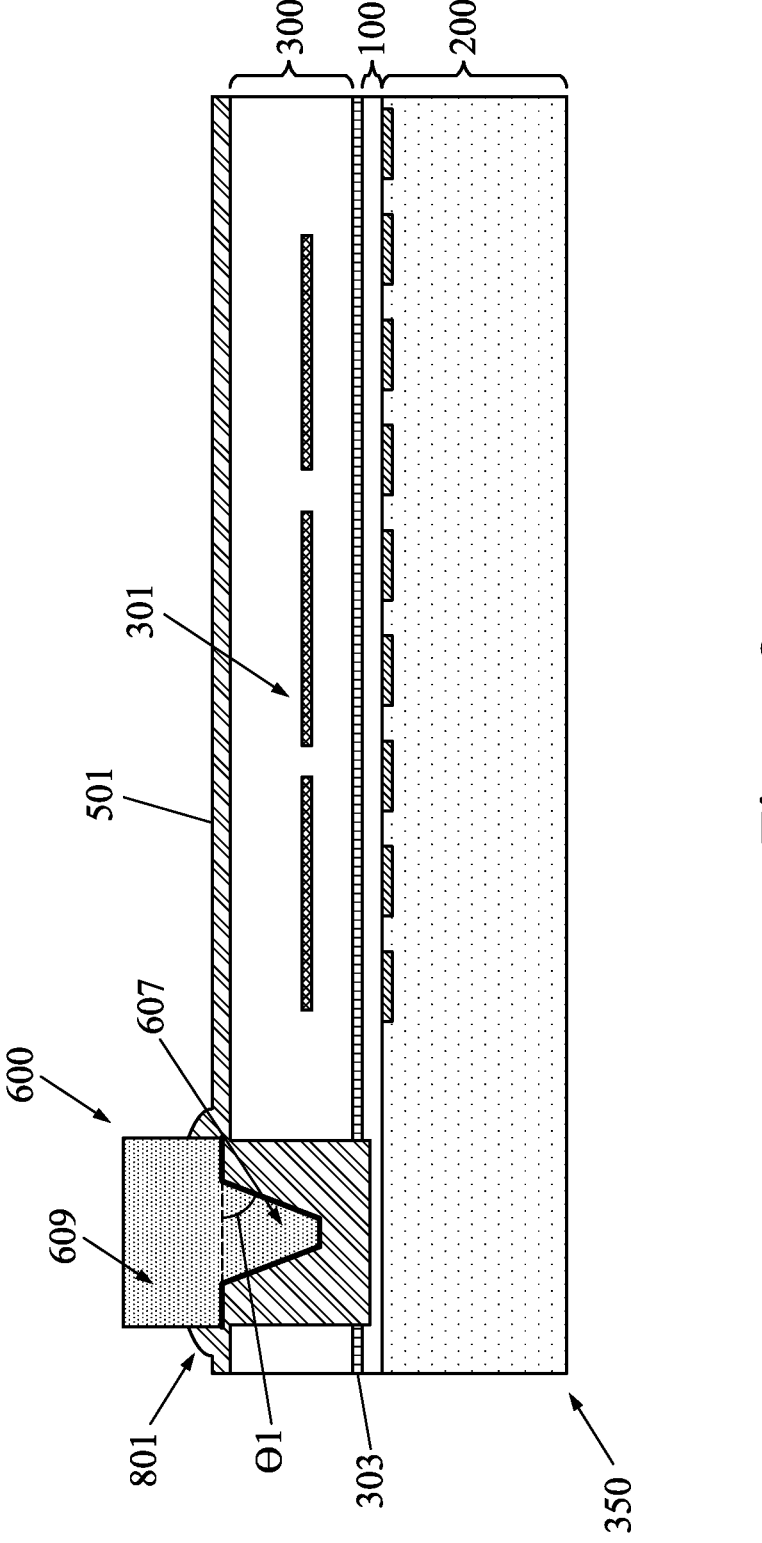
FIG. 8 depicts an embedding of a design-in mirror structure into the bonding material in accordance with some embodiments.

FIG. 8 illustrates placement and bonding of the first intermediate optical structure 600 into the PIC device 350. In accordance with some embodiments, the first intermediate optical structure 600 is aligned over the first opening 401 and the first intermediate optical structure 600 is then pushed into the bonding material 501 such that the first portion 607 of the base structure 601 is positioned within the first opening 401 and displaces a portion of the bonding material 501 out of the first opening 401. In this embodiment, the second portion 609 of the base structure 601 remains above the major surface of the backside optical layer 300 and the third portion of the bonding material 501 forms filets 801 of the bonding material 501 on opposing sides of the second portion 609 of the base structure 601.

In accordance with some embodiments, the bonding material 501 may be cured to bond the first intermediate optical structure 600 to the PIC device 350 by the bonding material 501. In an embodiment the curing parameters may be at a temperature in a range of 150° C. and 250° C., such as at 250° C. for a time period in a range of 45 minutes to 120 minutes, such as 60 minutes. It has been observed that if the curing temperature is below the temperature range then less robustness may occur and if the temperature is above the temperature range then crack may occur. It has also been observed that if the curing time period is less than the time period range then less robustness may occur and if the time period is more than the time period range then crack may occur.

FIG. 9 illustrates a first planarization process (represented in FIG. 9 by the arrow labeled 901) that removes excess material of the bonding material 501 and of the first intermediate optical structure 600. In accordance with some embodiments, the first planarization process 901 may be a CMP process, a grinding process, combinations of these, or the like. However, any suitable planarization process may be utilized. Following the first planarization process 901, FIG. 9 depicts the PIC device 350 with the first optical structure 900 embedded within the PIC device 350. The first optical structure 900 may act as a reflective mirror structure (e.g. a design-in mirror) for redirecting optical signals. In accordance with some embodiments, the first optical structure 900 is positioned within the PIC device 350 such that the first coupler component 309 of the second optical components 301 has a first interface I1 with the first optical structure 900 at the first angle Θ1. The first interface I1 allowing for desired transmission of optical signals between the first optical structure 900 and the first coupler component 309 of the second optical components 301.

Figure 10:
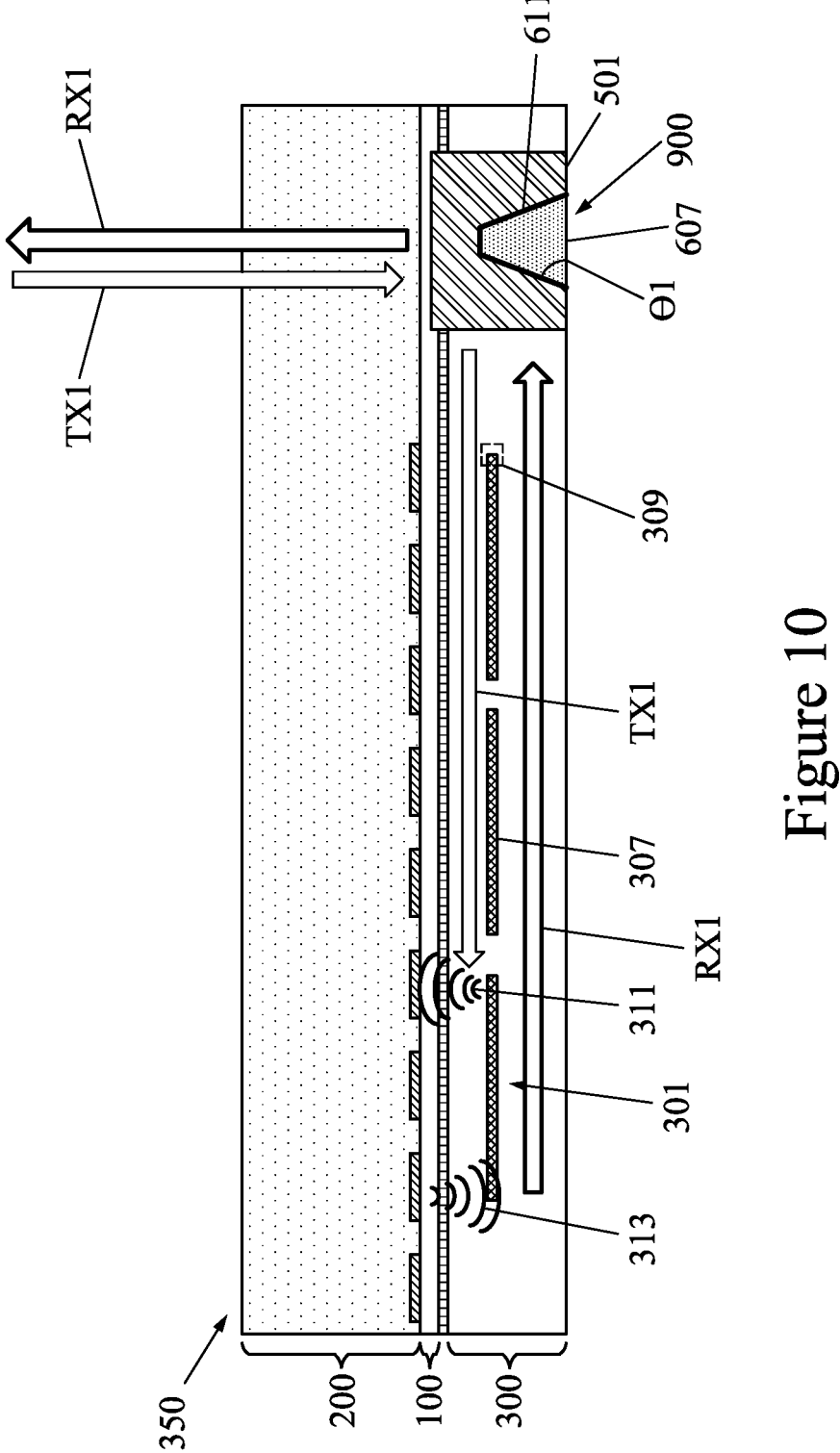
FIG. 10 depicts an optical signal path within an integrated circuit utilizing the design-in mirror in accordance with some embodiments.

FIG. 10 illustrates the PIC device 350 with the first optical structure 900 embedded within the PIC device 350 and a transmission path of the optical signals into, out of and through the PIC device 350. In accordance with some embodiments, the optical signals may include signals such as first transmission signals TX1 and first receiver signals RX1 that may be passed between the first coupler component 309 of the second optical components 301 and the first optical structure 900.

In an embodiment, the first transmission signals TX1 may be directed from outside the PIC device 350 (e.g., from an optical fiber) through the semiconductor device 200 and through a portion of the first device layer 100 until the first transmission signals TX1 pass through the bonding material 501 of the first optical structure 900 and hit the first reflective coating 611 of the first optical structure 900. The first reflective coating 611 redirects the first transmission signals TX1 towards the second optical components 301 in the backside optical layer 300 where the first transmission signals TX1 are caught by the first coupler component 309 of the second optical components 301 that then passes the first transmission signals TX1 along the waveguides 307 of the second optical components 301 within the backside optical layer 300.

The first transmission signals TX1 may then be redirected by the first directional optical component 311 of the second optical components 301 that directs the first transmission signals TX1 towards the first device layer 100. The first transmission signals TX1 in the first device layer may then by converted to electrical signals, which may then be directed through the first metallization layers 111 to the semiconductor device 200.

In an embodiment, the first receiver signals RX1 may be generated in the first device layer 100 and directed towards the second directional optical component 313 of the second optical components 301 within the backside optical layer 300 that receives the first receiver signals RX1. The first receiver signals RX1 may then be passed along the backside optical layer 300 through the waveguides 307 of the second optical components 301 until reaching the first coupler component 309 of the second optical components 301. The first coupler component 309 may then direct the first receiver signals RX1 to the first optical structure 900 where upon hitting the first reflective coating 611 the first receiver signals RX1 may be redirected out of the backside optical layer through the semiconductor device 200 and out of the PIC device 350 (e.g., to an optical fiber).

The embodiments embedding the first optical structure 900 into the PIC device 350 may improve manufacturing reliability, improve optical alignment and reduce manufacturing costs over utilizing traditional alignment methods for optical components for capturing external optical signals by providing a method of manufacturing a design-in mirror structure capable of redirecting optical signals into and out of the PIC device 350 with acceptable signal transmission. Further, the first optical structure 900 by utilizing reflective coatings to redirect optical signals in different directions allows for greater flexibility from where optical signals may enter or exit the PIC device 350.

FIGS. 11 through 17 illustrate various steps of an embodiment in which a second optical structure 1600 (shown in FIG. 16) is formed in the PIC device 350. The second optical structure 1600 may be referred to as a design-in mirror structure and may be utilized for light (e.g. optical signals) redirection within the PIC device 350. The second optical structure 1600 is formed within the backside optical layer 300 by filling (in part with a reflective material) a hole in the backside optical layer 300 formed to a desired geometry for the design-in mirror structure.

Figure 11:
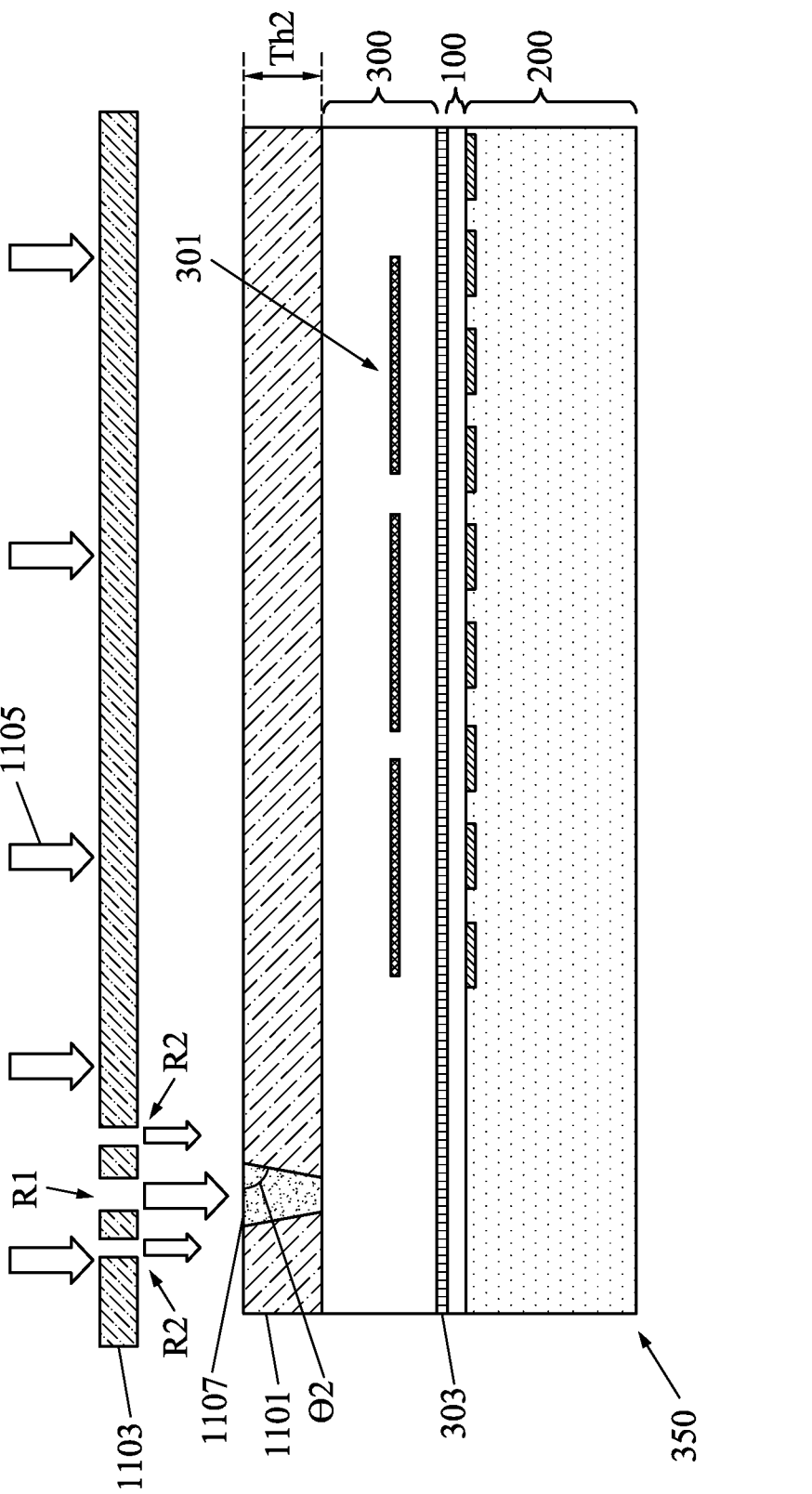
FIG. 11 depicts a patterning of a photoresist over the backside optical interconnect in accordance with some embodiments.

FIG. 11 illustrates a formation of a first photoresist layer 1101 over the backside optical layer 300 of the PIC device 350 and a corresponding first mask 1103 utilized in a first patterning process 1105. In an embodiment, the first photoresist layer 1101 may be a single layer of a photosensitive material. The first photoresist layer 1101 may be formed over the backside optical layer 300 by depositing the photosensitive material by spin-on coating. However, any suitable deposition process may be utilized. The first photoresist layer 1101 may be formed to a second thickness Th2 in a range of 5 μm to 15 μm. It has been observed that if the first photoresist layer 1101 is formed to a thickness outside the range of the second thickness Th2 the desired geometry of the subsequently formed third opening 1301 in the backside optical layer 300 (discussed in greater detail below with respect to FIG. 13) may not be achievable.

In accordance with some embodiments, the first patterning process 1105 utilizing the first mask 1103 is performed on the first photoresist layer 1101 to form a pattern 1107 in the first photoresist layer 1101. The first mask 1103 has transparency regions where radiation from a radiating source is able to pass through the first mask 1103 during the first patterning process 1105. In an embodiment, the transparency regions are partially transparent (e.g. the transparency regions are not completely transparent), the degree of transparency in the transparency regions determining an amount of the radiation transmissible through the transparency regions of the first mask 1103 during the first patterning process 1105. In some embodiments, a transparency gradient exists within the transparency regions, such that the transparency regions has first regions R1 with a higher degree of transparency and second regions R2 with a lower degree of transparency. In an embodiment, the first regions R1 are located at a center of the transparency regions and the second regions R2 are located at the edges of the transparency regions. In this embodiment, the degree of transparency may decrease across the transparency regions from the first regions R1 towards the second regions R2 of the transparency regions in the first mask 1103.

During the first patterning process 1105 the radiating source directs the radiation toward the first mask 1103 where portions of the radiation are able to pass through the transparency regions of the first mask 1103 forming a patterned energy source. In some embodiments, the radiating source is a light source such that the radiation and corresponding patterned energy source is light (e.g. ultra-violet (UV) light). The first photoresist layer 1101 is exposed to the patterned energy source during an imaging step of the first patterning process 1105. The imaging step of the first patterning process 1105 forming the pattern 1107 in the first photoresist layer 1101 corresponding to the patterned energy source applied during the imaging step.

In accordance with some embodiments, a geometry of the pattern 1107 is dependent upon the patterned energy source generated by the transparency gradient between the first regions R1 and the second regions R2 in the transparency regions of the first mask 1103 and the second thickness Th2 of the first photoresist layer 1101 that the patterned energy source is exposed to. By having the transparency regions of the first mask 1103 be partially transparent the amount of energy various portions of the first photoresist layer 1101 is exposed to may be controlled by adjusting the transparency gradient. By controlling the amount of energy the various portions of the first photoresist layer 1101 is exposed to the patterned energy source may penetrate further into the first photoresist layer 1101 at areas corresponding to the first regions R1 of greater transparency and may not penetrate as far into the first photoresist layer 1101 at areas corresponding to the second regions R2 of lesser transparency. A penetration depth of the patterned energy source into the first photoresist layer 1101 varies according to the transparency gradient of the transparency regions of the first mask 1103. The penetration depth of the patterned energy source into the first photoresist layer 1101 during the first patterning process 1105 may form the pattern 1107 to have sloped sidewalls corresponding to the penetration depth of the patterned energy source. As such, a desired geometry of the pattern 1107 may be achieved where the pattern 1107 may have a second angle $\Theta2$ between the sloped sidewalls of the pattern 1107 and a top surface of the pattern 1107. In an embodiment, the second angle $\Theta2$ may be in a range of 40 degrees to 60 degrees (such as 54.7 degrees, 45 degrees, or 42.5 degrees). It has been observed that if the angle between the sloped sidewalls of the pattern 1107 and the top surface of the pattern 1107 is not in the range of the second angle $\Theta2$ an unacceptably poor signal retention occurs between the second optical structure 1600 and second optical components 301.

Figure 12:
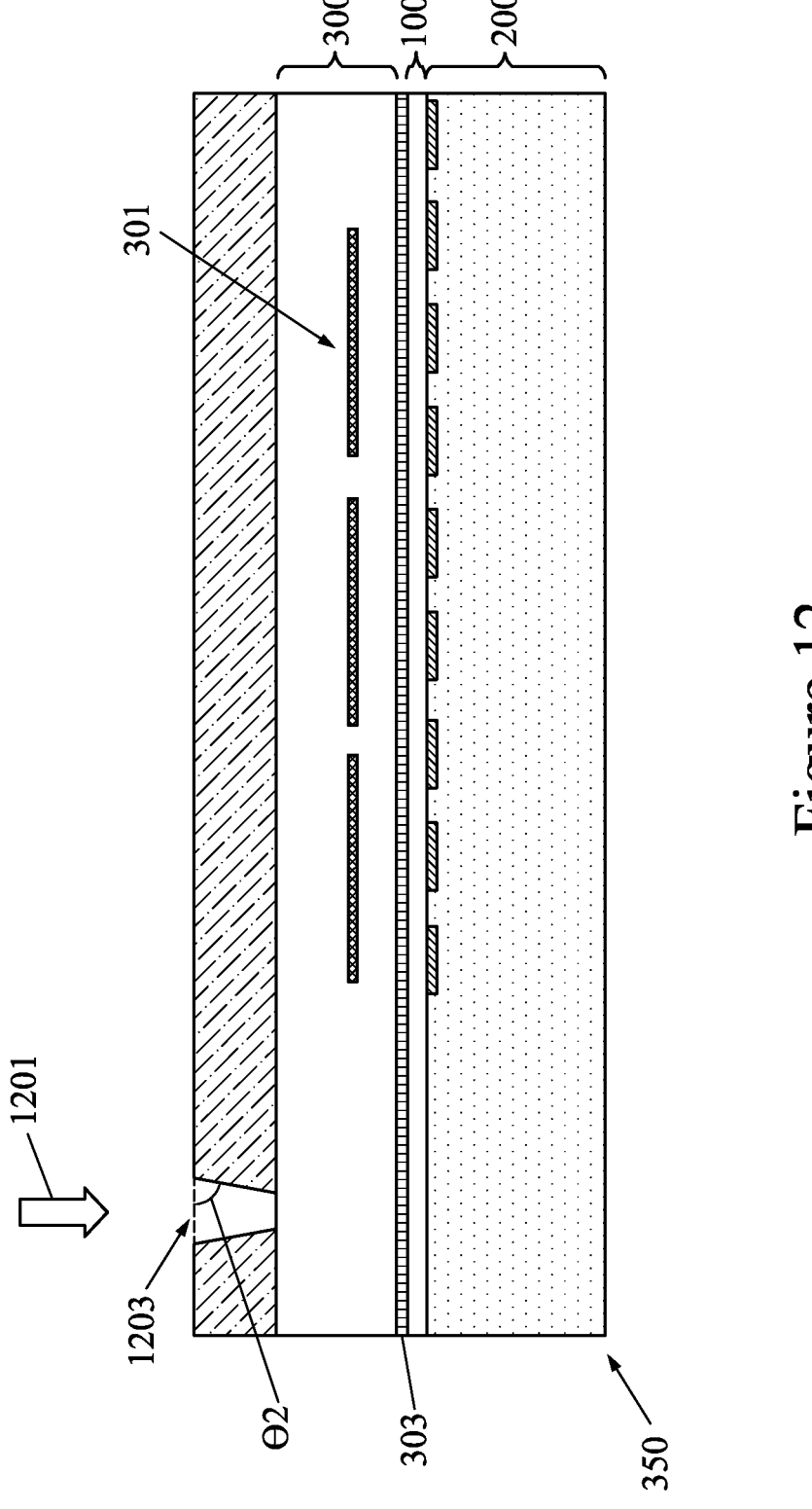
FIG. 12 depicts a forming of a second hole with slanted sidewalls in the photoresist in accordance with some embodiments.

FIG. 12 illustrates a developing step 1201 applied to the first photoresist layer 1101. The developing step 1201 involves applying a developer, such as tetramethylammonium hydroxide (TMAH) to the first photoresist layer 1101 utilizing such methods as spin-on coating to deliver the developer. However, any suitable developer and delivery method may be utilized. The developer physically removes the pattern 1107 of the first photoresist layer 1101 exposed to the patterned energy source forming the second opening 1203 in the first photoresist layer 1101. In an embodiment, following the developing step 1201, the second opening 1203 has the second angle $\Theta2$ between sloped sidewalls of the second opening 1203 and at a top plane of the second opening 1203.

In an embodiment, additional steps may be applied to the first photoresist layer 1101 such as, a post-exposure bake (PEB) performed on the first photoresist layer 1101 following the imaging step, and a hard-bake step applied to the first photoresist layer 1101 following the developing step 1201. Any suitable number of applicable additional steps may be performed on the first photoresist layer 1101.

Figure 13:
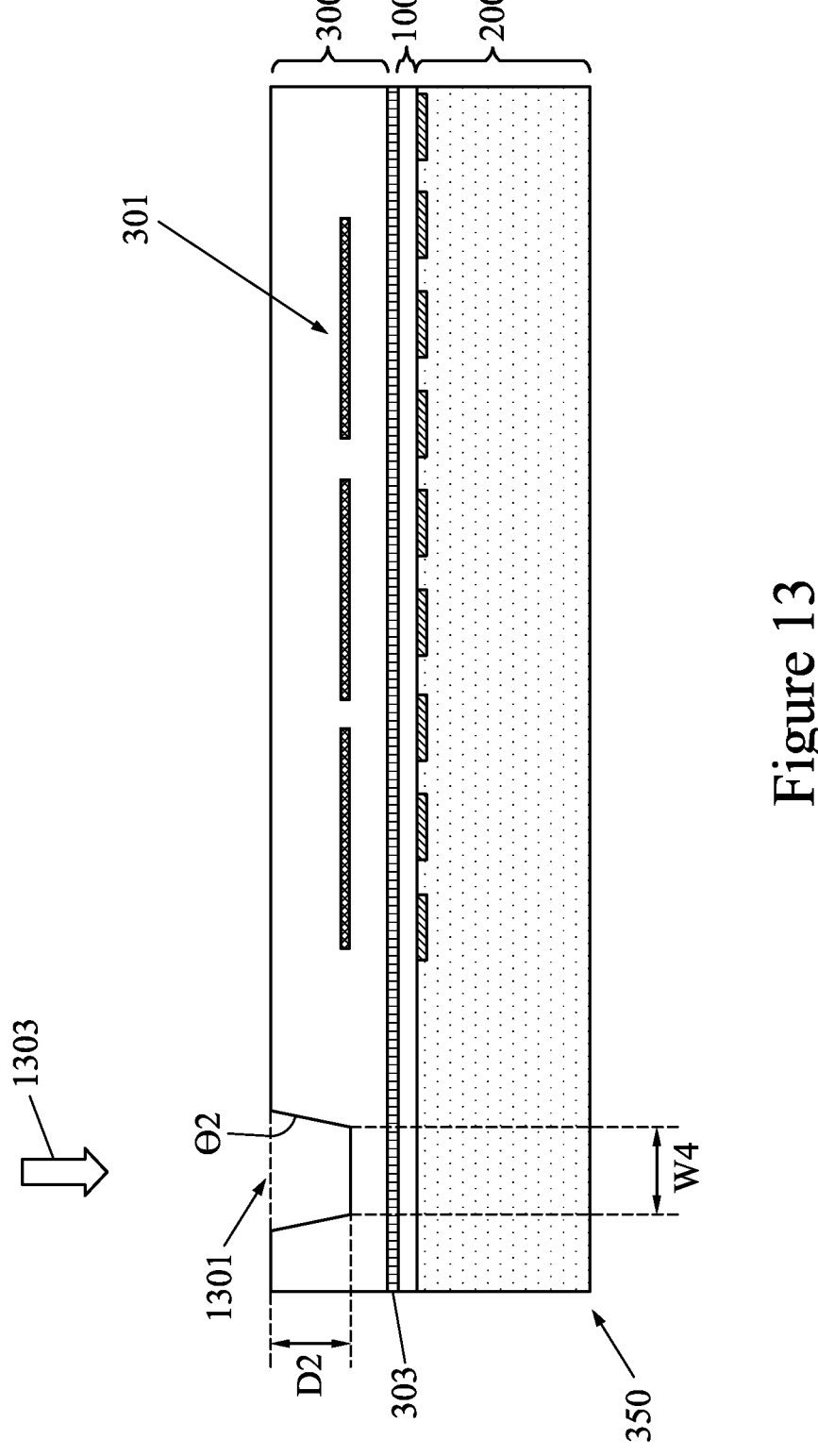
FIG. 13 depicts a forming of a third hole with the slanted sidewalls in the backside optical interconnect in accordance with some embodiments.

FIG. 13 illustrates a formation of a third opening 1301 in the backside optical layer 300 by applying a second etching process 1303 through the second opening 1203 in the first photoresist layer 1101 and a removal of the first photoresist layer 1101. In accordance with some embodiments the third opening 1301 is formed by the second etching process 1303 transferring desired geometries of the second opening 1203 to the third opening 1301, such as the second angle $\Theta2$. The second etching process 1303 may 1303 may be one or more etching processes, such as a dry etch process, a wet etch process, a reactive ion etching process, the like, or a combination thereof, that reacts with both the material of the backside optical layer 300 and the first photoresist layer 1101. In accordance with some embodiments, the second etching process 1303 may be performed for a period of time in a range between 30 min and 1 hr. It has been observed that if the second etching process 1303 is performed for more or less time than the period of time, the desired geometry of the third opening 1301 in the backside optical layer 300 may not be achievable. However, any suitable etching process utilizing any suitable etchants and etching parameters may be used.

Following the second etching process 1303, the third opening 1301, formed by the second etching process 1303 in the backside optical layer 300, may have sloped sidewalls and is wider than the second opening 1203. In accordance with some embodiments, the third opening 1301 may have the desired geometry where the sloped sidewalls of the third opening 1301 and a top surface of the third opening 1301 have the second angle $\Theta2$ and the bottom surface of the third opening 1301 has a second depth D2 into the backside optical layer 300 and a fourth width W4 at a bottom surface of the third opening 1301. In accordance with some embodiments, the second angle $\Theta2$ may be in a range of 40 degrees to 60 degrees (such as 54.7 degrees, 45 degrees, or 42.5 degrees). It has been observed that if the angle between the sloped sidewalls of the third opening 1301 and the top surface of the third opening 1301 is not in the range of the second angle $\Theta2$ an unacceptably poor signal retention occurs between the second optical structure 1600 and the first coupler component 309 of the second optical components 301. In accordance with some embodiments, the second depth D2 is in a range between 5 μm and 15 μm and the fourth width W4 is in range between 5 μm and 20 μm. It has been observed that if the bottom surface of the third opening 1301 is not at the second depth D2 and the width at the bottom surface is not the fourth width W4 an unacceptably poor signal retention occurs between the second optical structure 1600 and second optical components 301.

In accordance with some embodiments, following the formation of the third opening 1301, any remaining portion of the first photoresist layer 1101 that is still present after the second etching process 1303 has been performed may be removed. The first photoresist layer 1101 may be removed using an ashing process, whereby a temperature of the first photoresist layer 1101 is raised to induce a thermal decomposition, which may then be easily removed. However, any suitable method may be used in order to remove the first photoresist layer 1101.

Figure 14:
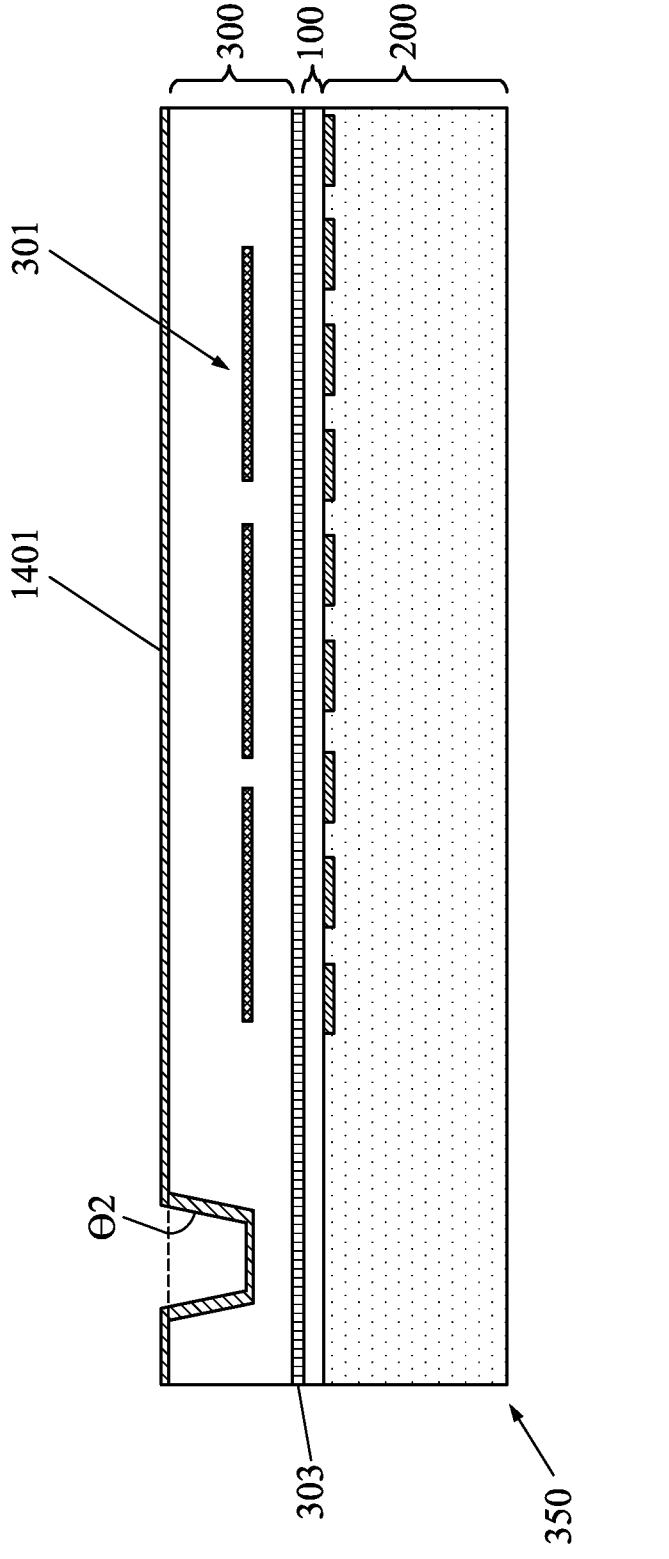
FIG. 14 depicts a deposition of a reflective coating over exposed surfaces of the backside optical interconnect in accordance with some embodiments.

FIG. 14 illustrates a formation of a first seed layer 1401 along the sloped sidewalls and the bottom surface of the third opening 1301 and across the major surface of the backside optical layer 300. The first seed layer 1401 may be blanket deposited over the surface of the backside optical layer 300 and exposed surfaces of the third opening 1301. The first seed layer 1401 may comprise a metal such as copper, titanium, titanium nitride, aluminum, aluminum nitride, gold, gold nitride, aluminum copper, or the like. The first seed layer 1401 may be deposited using processes such as sputtering, evaporation, or plasma-enhanced chemical vapor deposition (PECVD), or the like, depending upon the desired materials. However, any suitable material or deposition process may be used. In accordance with some embodiments, the first seed layer 1401 may act as a top surface of a reflective coating for the second optical structure 1600 suitable for redirecting optical signals within the PIC device 350 (discussed in greater detail below with respect to FIG. 17).

Figure 15:
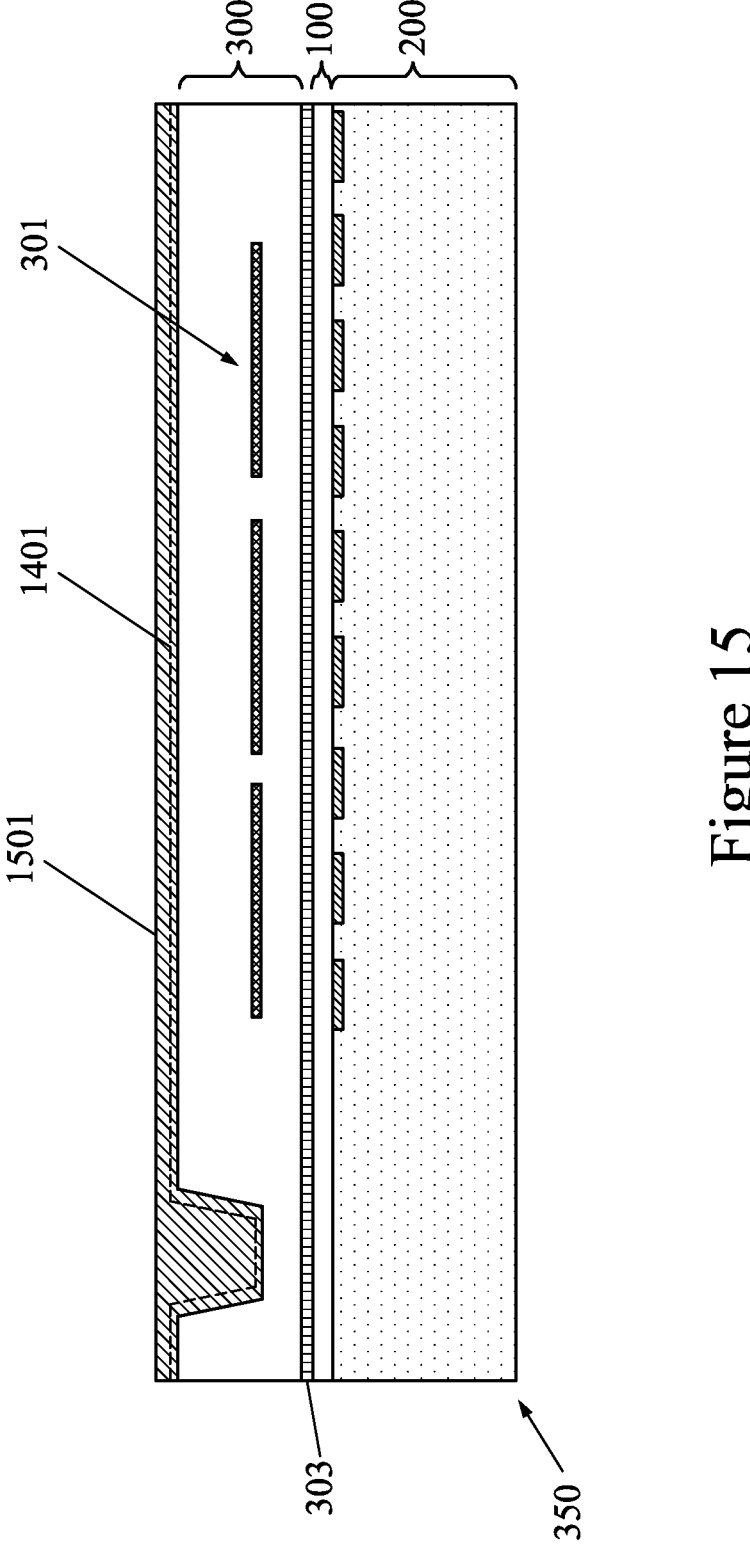
FIG. 15 depicts a filling of the third hole over the reflective coating with a filler material in accordance with some embodiments.

FIG. 15 illustrates a formation of a first plate material 1501 of the second optical structure 1600 formed over the first seed layer 1401. The first plate material 1501 may act as a base material. In an embodiment, the first plate material 1501 may be deposited over the first seed layer 1401 through a plating process such as electrical or electro-less plating. The plate material may comprise copper, a copper alloy, aluminum, an aluminum alloy, gold, a gold alloy, titanium, a titanium alloy, a-Si, $SiO_x$, $Si_xN_y$, $Ta_xO_y$, $Nb_xO_y$ or the like and any combination. The first plate material 1501 may be a fill material. However, any suitable material or plating process may be used.

Figure 16:
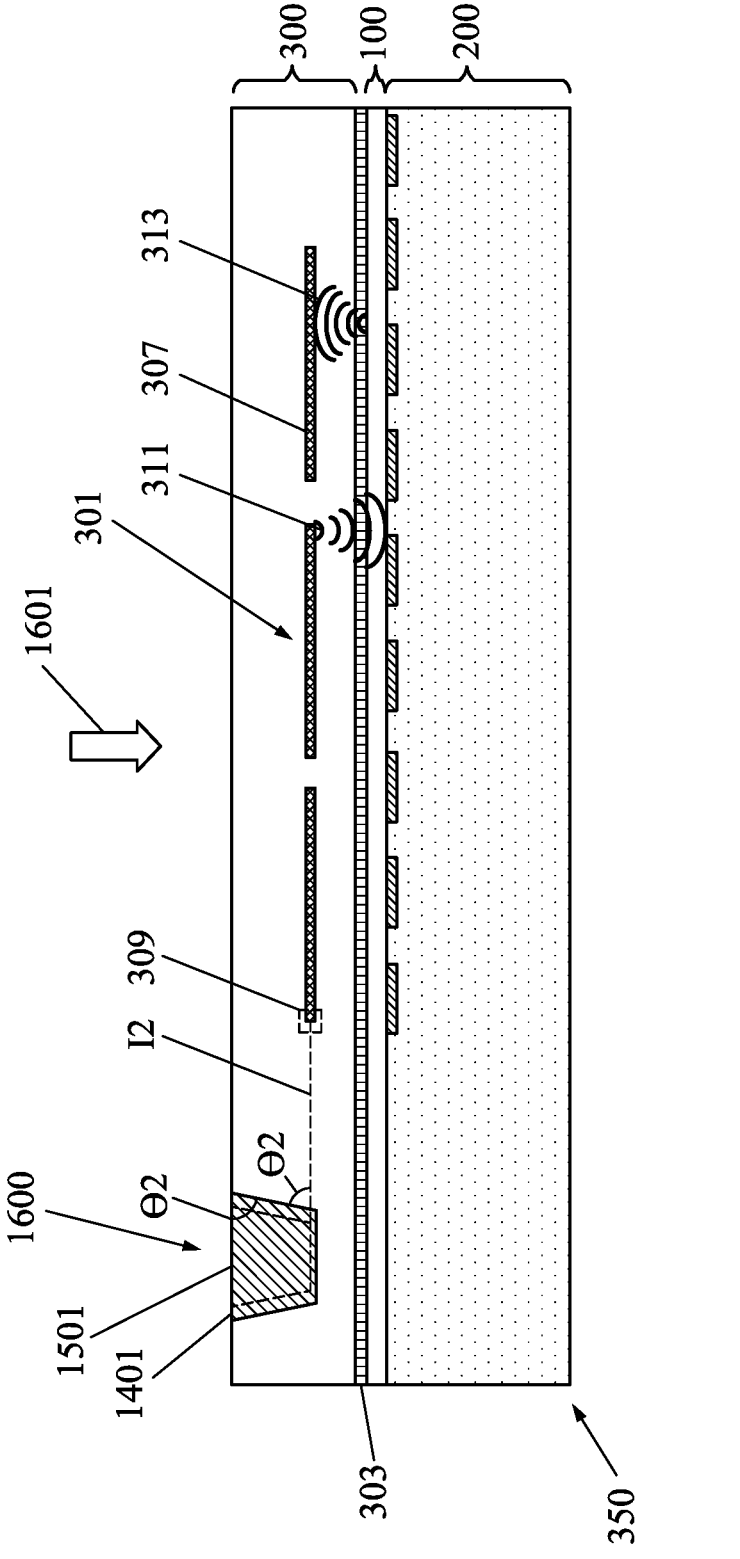
FIG. 16 depicts a removal of excess of the filler material and the reflective coating not in the third hole forming a third design-in mirror in the backside optical interconnect in accordance with some embodiments.

FIG. 16 illustrates a second planarization process 1601 that removes excess material of the first plate material 1501 and the first seed layer 1401. In accordance with some embodiments, the second planarization process 1601 may be a CMP process, a grinding process, combinations of these, or the like. However, any suitable planarization process may be utilized. Following the second planarization process 1601, FIG. 16 depicts the PIC device 350 with the second optical structure 1600 embedded within the PIC device 350. The second optical structure 1600 may act as a reflective mirror structure (e.g., a design-in mirror) for redirecting optical signals. In accordance with some embodiments, the second optical structure 1600 is positioned within the PIC device 350 such that the first coupler component 309 of the second optical components 301 has a second interface I2 with the second optical structure 1600 at the second angle Θ2. The second interface I2 allowing for desired transmission of optical signals between the second optical structure 1600 and the first coupler component 309 of the second optical components 301.

Figure 17:
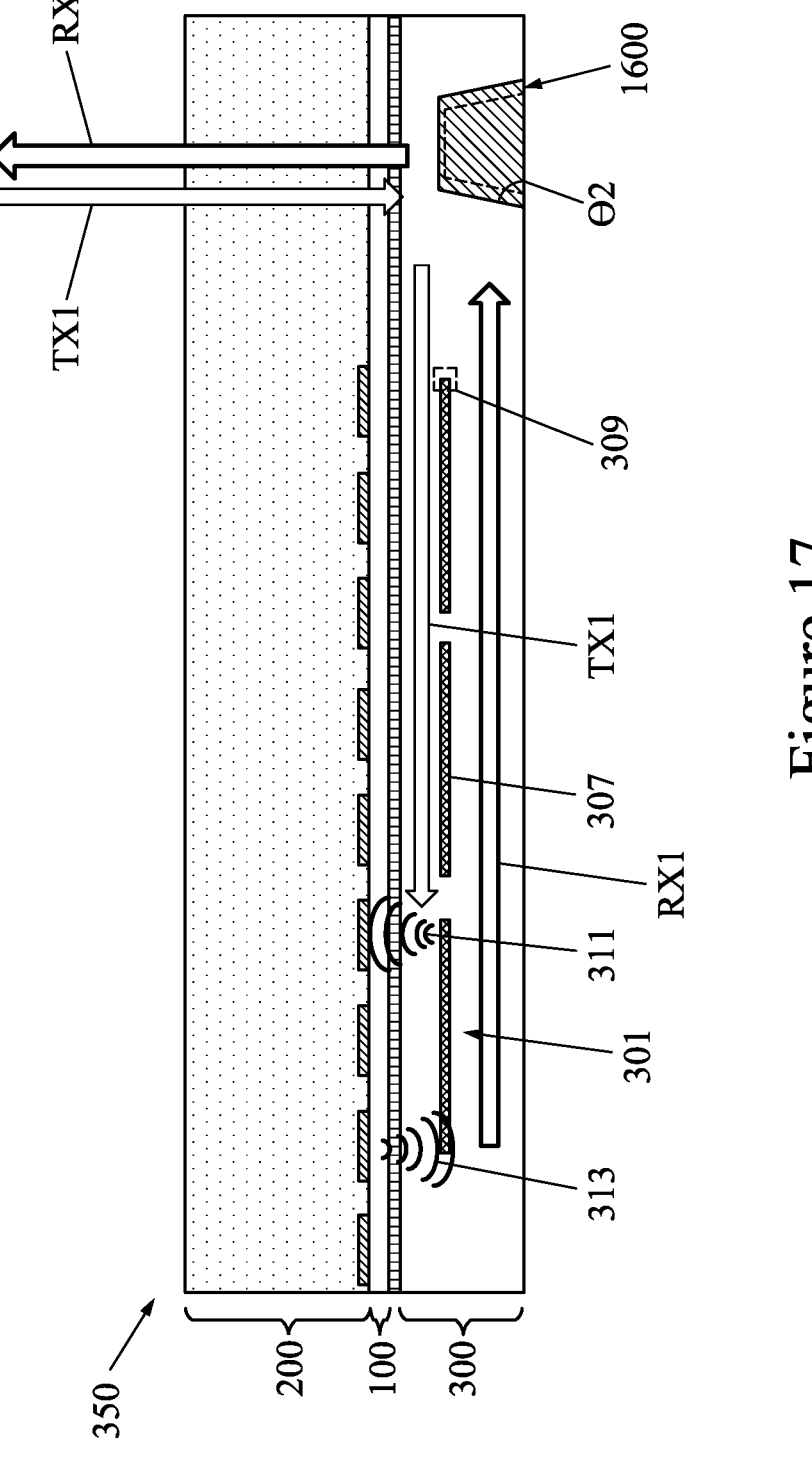
FIG. 17 depicts the optical signal pathing within the integrated circuit utilizing the design-in mirror in accordance with some embodiments.

FIG. 17 illustrates the PIC device 350 with the second optical structure 1600 embedded within the PIC device 350 and a transmission path of the optical signals into, out of and through the PIC device 350. In accordance with some embodiments, the optical signals may include signals such as the first transmission signals TX1 and the first receiver signals RX1 that may be passed between the first coupler component 309 of the second optical components 301 and the second optical structure 1600 in a similar manner as discussed with respect to FIG. 10 above.

The embodiments forming the second optical structure 1600 into the PIC device 350 include improved manufacturing reliability, improve optical alignment and reduce manufacturing costs over utilizing traditional optical components such as edge couplers for capturing external optical signals by providing a method of manufacturing a design-in mirror structure capable of redirecting optical signals into and out of the PIC device 350 with acceptable signal transmission. Further, the second optical structure 1600 by utilizing reflective coatings to redirect optical signals in different directions allows for greater flexibility from where optical signals may enter or exit the PIC device 350.

Figure 18A:
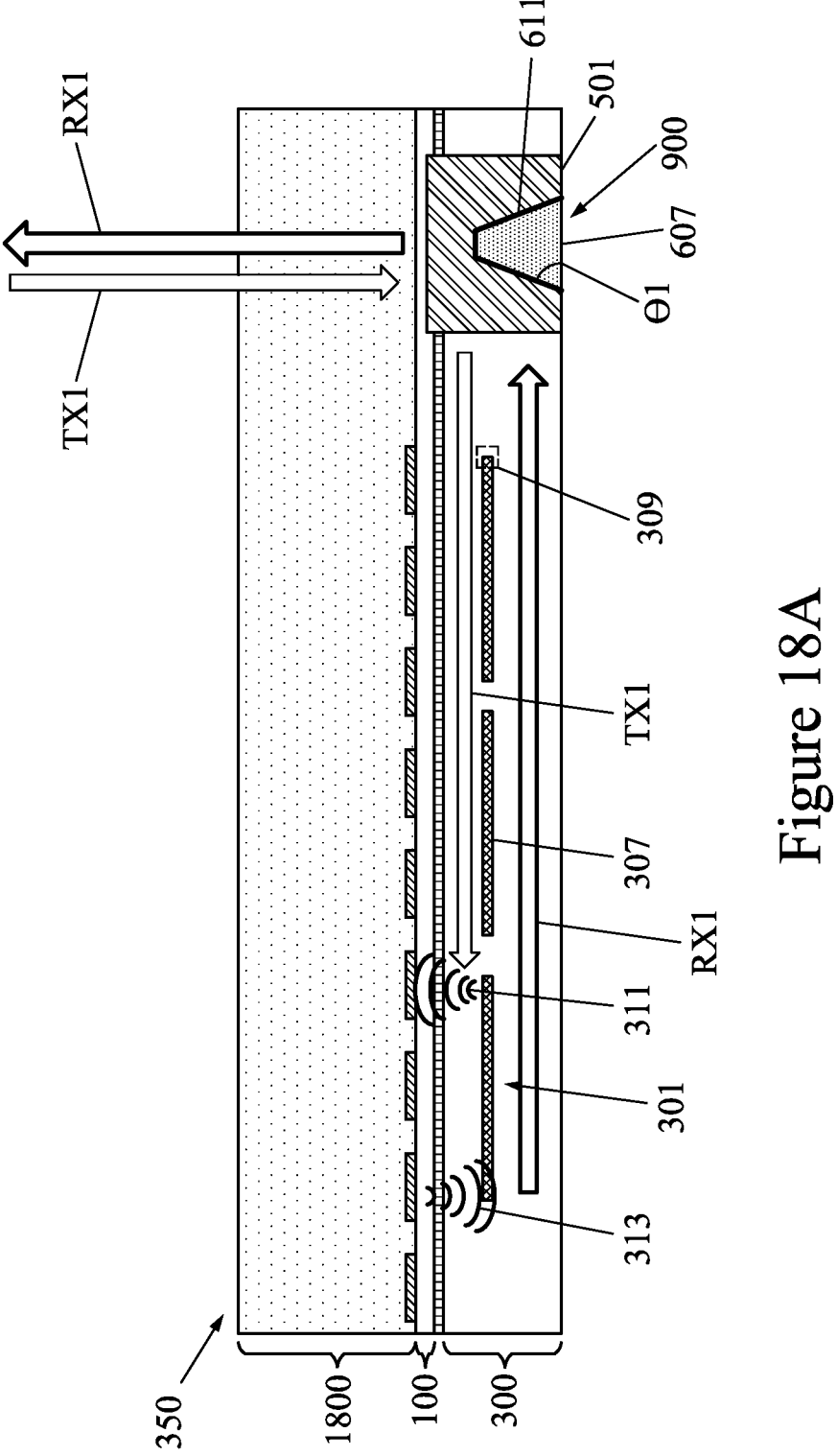
FIGS. 18A and 18B depict attaching a device layer to a substrate and forming a backside optical layer opposing the substrate with a design-in mirror in the backside optical layer in accordance with some embodiments.
Figure 18B:
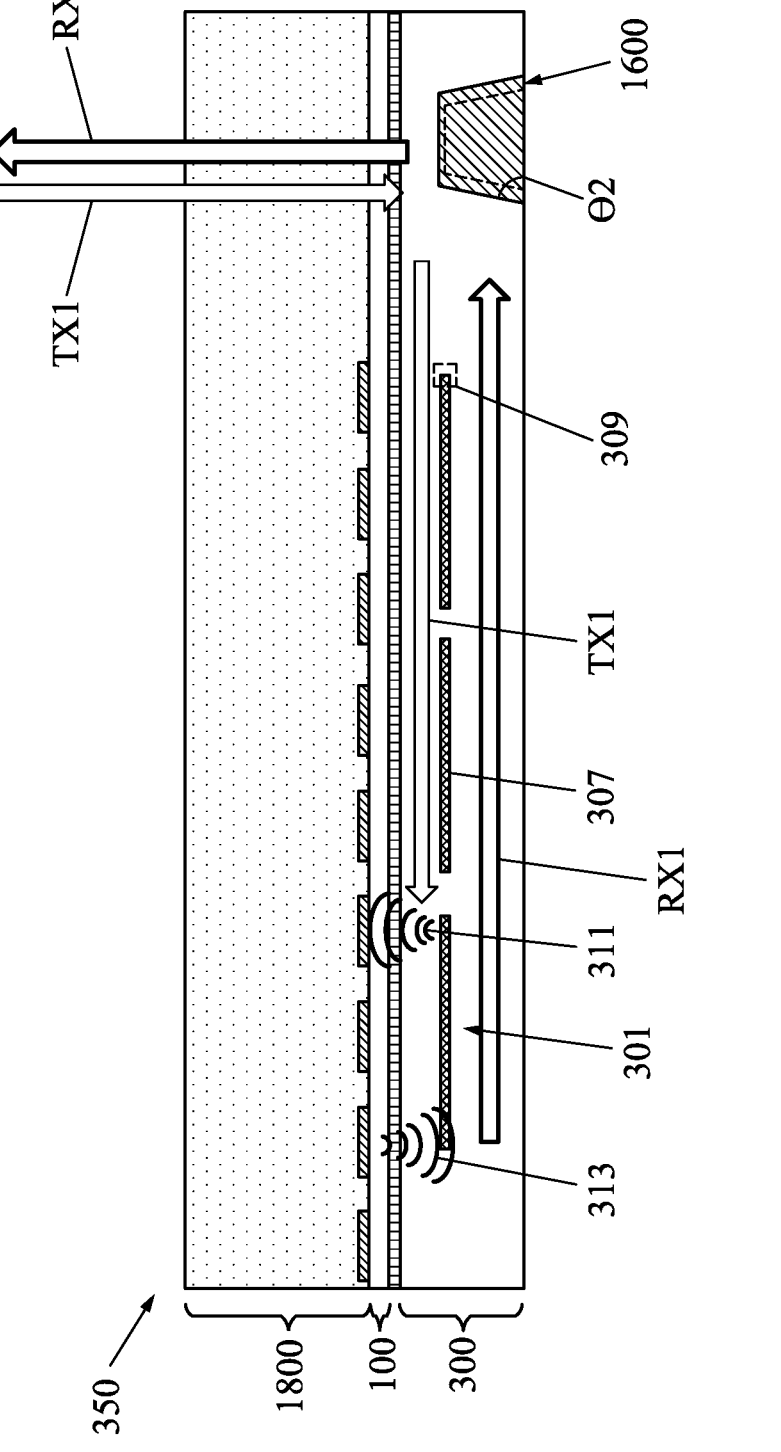

FIGS. 18A and 18B depict alternative embodiments where in lieu of attaching the first device layer 100 to the semiconductor device 200, the first device layer 100 is attached to a second substrate 1800. In these embodiment, the second substrate 1800 may 1800 may be a transparent material such as silicon (e.g., bulk silicon) without any active devices or metallization layers formed thereon. In these embodiments, the first device layer 100 is formed in a similar manner as discussed above with the exception that the first bonding layer 113 may not contain the first bond pads 117. The first device layer 100 is then attached to the second substrate 1800 (using, e.g., a dielectric-to-dielectric fusion bond) and the first substrate 101 may be removed in a similar manner as discussed above with respect to FIG. 2 and the backside optical layer 300 may be formed on the first device layer 100 in a similar manner as discussed above with respect to FIGS. 3-17.

FIG. 18A depicts an embodiment where the second substrate 1800 is utilized in place of the semiconductor device 200 and the first optical structure 900 is embedded within the backside optical layer 300 of the PIC device 350. In this embodiment, the first optical structure 900 is formed in a similar manner as discussed above with respect to FIGS. 4 through 9. The resulting PIC device 350 may transfer optical signals in a manner similar as discussed with respect to FIG. 10.

FIG. 18B depicts an embodiment where the second substrate 1800 is utilized in place of the semiconductor device 200 and the second optical structure 1600 is formed within the backside optical layer 300 of the PIC device 350. In this embodiment, the second optical structure 1600 is formed in a similar manner as discussed above with respect to FIGS. 11 through 16. The resulting PIC device 350 may transfer optical signals in a manner similar as discussed with respect to FIG. 17.

Additionally, while the embodiments described above illustrate the design-in mirror structure as being part of a bonded device, this is intended to be illustrative and is not intended to limit the embodiments to the precise descriptions presented herein. In other embodiments, the backside optical layer 300 and the first optical structure 900 and formed over the first substrate 101 after formation of the first device layer 100 and/or the first metallization layers 111. All such embodiments are fully intended to be included within the scope of the embodiments.

Benefits of the embodiments presented in the present disclosure include, but are not limited to, improved functional flexibility of the PIC device 350, improved manufacturing reliability of the PIC device 350, and reduced cost of manufacturing the PIC device 350 through the use of design-in mirror structures represented by embodiments detailing the first optical structure 900 and the second optical structure 1600. By using the design-in mirror structure an optical structure for transmitting optical signals into and out of the PIC device 350 may be formed after forming the backside optical layer 300 resulting in improved manufacturing flexibility. The use of the reflective coating in the first optical structure 900 and the second optical structure 1600 allows for reduced manufacturing cost and improved manufacturing reliability over traditional optical capturing structures due to improved alignment. Further, the use of the reflective coating in the first optical structure 900 and the second optical structure 1600 allows for improved functional flexibility of the PIC device 350 by allowing optical signals to enter and exit the PIC device with less restrictive positioning requirements and then utilizing the first optical structure 900 or the second optical structure 1600 to redirect the optical signals within the PIC device 350.

In accordance with some embodiments of the present disclosure a method of manufacturing an integrated circuit device includes: forming an optical device layer; forming an optical layer on the optical device layer; after the forming the optical layer, forming a first opening in the optical layer; and embedding a reflective structure in the first opening. In an embodiment bonding the optical device layer to a bulk silicon substrate on a side opposite the optical layer. In an embodiment the embedding the reflective structure further includes placing a bonding material into the first opening and inserting the reflective structure into the bonding material. In an embodiment further including thermally curing the bonding material after the inserting the reflective structure into the bonding material. In an embodiment further including: forming a photoresist layer over the optical layer prior to forming the first opening in the optical layer; and imaging and developing the photoresist layer to form a second opening in the photoresist layer, wherein the second opening formed in the photoresist layer has sloped sidewalls and the forming the first opening in the optical layer includes performing an etch through the second opening. In an embodiment further including forming a first coupler in the optical layer prior to the forming the first opening, wherein the embedding the reflective structure includes positioning a reflective coating of the reflective structure at a 40 to 60 degree angle from the first coupler. In an embodiment the first coupler is an edge coupler.

In accordance with some embodiments of the present disclosure an integrated circuit device includes: a device layer including optical components; an electrical integrated circuit (EIC) structure bonded to the device layer; an optical layer on an opposite side of the device layer from the EIC structure, the optical layer including an edge coupler; and a reflective mirror structure embedded within the optical layer, the reflective mirror structure optically coupled to the edge coupler. In an embodiment further including a bonding material surrounding the reflective mirror structure, the bonding material having a same refraction index as a cladding material surrounding the edge coupler. In an embodiment the reflective mirror structure includes a reflective coating over a base material. In an embodiment the reflective coating includes a metal and the base material includes silicon. In an embodiment the reflective coating includes a metal and the base material includes the metal. In an embodiment the metal is copper.

In accordance with some embodiments of the present disclosure a method of manufacturing an optical device includes: forming an optical device structure over a first structure, the optical device structure including first optical components; bonding a second structure to the optical device structure opposite the first structure; removing the first structure and forming an optical interconnect structure where the first structure had been, wherein the optical interconnect structure includes second optical components; etching a first hole in the optical interconnect structure; and embedding a design-in mirror in the first hole. In an embodiment the design-in mirror further includes a reflective metal coating deposited over a silicon base. In an embodiment the design-in mirror is formed to be a trapezoidal prism prior to the embedding the design-in mirror in the first hole. In an embodiment the embedding the design-in mirror forms a first interface between the second optical components and a reflective coating of the design-in mirror, the first interface being at a 40 to 60 degree angle between the second optical components and the reflective coating. In an embodiment the first hole extends partially into the optical device structure. In an embodiment the first hole is filled with a bonding material prior to the embedding the design-in mirror in the first hole. In an embodiment the embedding the design-in mirror in the first hole displaces a portion of the bonding material forming filets around the design-in mirror outside the first hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device comprising:
    forming an optical device layer, wherein the optical device layer comprises one or more optical devices;
    forming an optical layer on the optical device layer;
    after the forming the optical layer, forming a first opening in the optical layer;
    embedding a reflective structure in the first opening, wherein after embedding the reflective structure in the first opening, the reflective structure protrudes from the first opening; and
    after embedding the reflective structure in the first opening, planarizing the reflective structure, wherein a surface of the reflective structure is substantially level with a surface of the optical layer, wherein the surface of the optical layer faces away from the optical device layer.

2. The method of claim 1, further comprising bonding the optical device layer to a bulk silicon substrate on a side opposite the optical layer.

3. The method of claim 1, wherein the embedding the reflective structure further comprises placing a bonding material into the first opening and inserting the reflective structure into the bonding material.

4. The method of claim 3, further comprising thermally curing the bonding material after the inserting the reflective structure into the bonding material.

5. The method of claim 1, further comprising:
    forming a photoresist layer over the optical layer prior to forming the first opening in the optical layer; and
    imaging and developing the photoresist layer to form a second opening in the photoresist layer, wherein the second opening formed in the photoresist layer has sloped sidewalls and the forming the first opening in the optical layer comprises performing an etch through the second opening.

6. The method of claim 1, further comprising forming a first coupler in the optical layer prior to the forming the first opening, wherein the embedding the reflective structure comprises positioning a reflective coating of the reflective structure at a 40 to 60 degree angle from the first coupler.

7. The method of claim 6, wherein the first coupler is an edge coupler.

8. The method of claim 1, wherein the first opening extends through the optical layer and into the optical device layer.

9. A method of manufacturing an optical device comprising:

forming an optical device structure over a first structure, the optical device structure comprising first optical components;

bonding a second structure to the optical device structure opposite the first structure;

removing the first structure and forming an optical interconnect structure where the first structure had been, wherein the optical interconnect structure comprises second optical components;

etching a first hole in the optical interconnect structure; and embedding a design-in mirror in the first hole.

10. The method of claim 9, wherein the design-in mirror further comprises a reflective metal coating deposited over a silicon base.

11. The method of claim 10, wherein the design-in mirror is formed to be a trapezoidal prism prior to the embedding the design-in mirror in the first hole.

12. The method of claim 9, wherein the embedding the design-in mirror forms a first interface between the second optical components and a reflective coating of the design-in mirror, the first interface being at a 40 to 60 degree angle between the second optical components and the reflective coating.

13. The method of claim 9, wherein the first hole extends partially into the optical device structure.

14. The method of claim 9, wherein the first hole is filled with a bonding material prior to the embedding the design-in mirror in the first hole.

15. The method of claim 14, wherein the embedding the design-in mirror in the first hole displaces a portion of the bonding material forming filets around the design-in mirror outside the first hole.

16. A method of manufacturing an optical device comprising:

forming an optical device layer over a semiconductor device;

forming a backside optical layer over the optical device layer, the backside optical layer including an optical component, wherein the optical component is configured for optical communications with the optical device layer;

forming an opening in the backside optical layer;

placing a bonding material in the opening;

after placing the bonding material in the opening, placing an intermediate optical structure in the opening, wherein the intermediate optical structure comprises a reflective surface, wherein the reflective surface is optically aligned with the optical component of the backside optical layer, wherein the intermediate optical structure protrudes from the opening; and planarizing the intermediate optical structure.

17. The method of claim 16, wherein a surface of the intermediate optical structure is level with a surface of the backside optical layer.

18. The method of claim 16, wherein the opening extends completely through the backside optical layer.

19. The method of claim 18, wherein the opening extends into the optical device layer.

20. The method of claim 16, wherein the intermediate optical structure comprises a reflective coating on a silicon structure.

* * * * *